United States Patent
Shalvi et al.

(10) Patent No.: US 8,595,591 B1
(45) Date of Patent: Nov. 26, 2013

(54) INTERFERENCE-AWARE ASSIGNMENT OF PROGRAMMING LEVELS IN ANALOG MEMORY CELLS

(75) Inventors: Ofir Shalvi, Ra'anana (IL); Naftali Sommer, Rishon Lezion (IL); Ronen Dar, Tel Aviv (IL); Micha Anholt, Tel Aviv (IL)

(73) Assignee: Apple Inc., Cupertino, CA (US)

(*) Notice: Subject to any disclaimer, the term of this patent is extended or adjusted under 35 U.S.C. 154(b) by 223 days.

(21) Appl. No.: 13/176,761

(22) Filed: Jul. 6, 2011

Related U.S. Application Data

(60) Provisional application No. 61/363,248, filed on Jul. 11, 2010, provisional application No. 61/372,921, filed on Aug. 12, 2010, provisional application No. 61/417,218, filed on Nov. 25, 2010, provisional application No. 61/417,315, filed on Nov. 26, 2010.

(51) Int. Cl.
   *G11C 29/00* (2006.01)
   *G11C 11/34* (2006.01)
   *G11C 16/04* (2006.01)
   *G11C 16/06* (2006.01)

(52) U.S. Cl.
   USPC ............. 714/763; 365/185.18; 365/185.22; 365/185.09

(58) Field of Classification Search
   None
   See application file for complete search history.

(56) References Cited

U.S. PATENT DOCUMENTS

| | | | |
|---|---|---|---|
| 3,668,631 A | 6/1972 | Griffith et al. | |
| 3,668,632 A | 6/1972 | Oldham | |
| 4,058,851 A | 11/1977 | Scheuneman | |
| 4,112,502 A | 9/1978 | Scheuneman | |
| 4,394,763 A | 7/1983 | Nagano et al. | |
| 4,413,339 A | 11/1983 | Riggle et al. | |
| 4,556,961 A | 12/1985 | Iwahashi et al. | |
| 4,558,431 A | 12/1985 | Satoh | |
| 4,608,687 A | 8/1986 | Dutton | |
| 4,654,847 A | 3/1987 | Dutton | |
| 4,661,929 A | 4/1987 | Aoki et al. | |
| 4,768,171 A | 8/1988 | Tada | |
| 4,811,285 A | 3/1989 | Walker et al. | |

(Continued)

FOREIGN PATENT DOCUMENTS

| | | |
|---|---|---|
| EP | 0783754 B1 | 7/1997 |
| EP | 1434236 B1 | 6/2004 |
| EP | 1605509 A1 | 12/2005 |
| WO | 9610256 A1 | 4/1996 |
| WO | 9828745 A1 | 7/1998 |
| WO | 2002100112 A1 | 12/2002 |

(Continued)

OTHER PUBLICATIONS

Agrell et al., "Closest Point Search in Lattices", IEEE Transactions on Information Theory, vol. 48, No. 8, pp. 2201-2214, Aug. 2002.

(Continued)

*Primary Examiner* — Guerrier Merant
(74) *Attorney, Agent, or Firm* — Meyertons, Hood, Kivlin, Kowert & Goetzel, P.C.

(57) ABSTRACT

A method for data storage includes accepting data for storage in a memory including multiple analog memory cells. For each memory cell, a respective set of nominal analog values is assigned for representing data values to be stored in the memory cell, by choosing the nominal analog values for a given memory cell in a respective range that depends on interference between the given memory cell and at least one other memory cell in the memory. The data is stored in each memory cell using the respective selected set of the nominal analog values.

43 Claims, 6 Drawing Sheets

(56) References Cited

U.S. PATENT DOCUMENTS

| | | |
|---|---|---|
| 4,899,342 A | 2/1990 | Potter et al. |
| 4,910,706 A | 3/1990 | Hyatt |
| 4,993,029 A | 2/1991 | Galbraith et al. |
| 5,056,089 A | 10/1991 | Furuta et al. |
| 5,077,722 A | 12/1991 | Geist et al. |
| 5,126,808 A | 6/1992 | Montalvo et al. |
| 5,163,021 A | 11/1992 | Mehrotra et al. |
| 5,172,338 A | 12/1992 | Mehrotta et al. |
| 5,182,558 A | 1/1993 | Mayo |
| 5,182,752 A | 1/1993 | DeRoo et al. |
| 5,191,584 A | 3/1993 | Anderson |
| 5,200,959 A | 4/1993 | Gross et al. |
| 5,237,535 A | 8/1993 | Mielke et al. |
| 5,272,669 A | 12/1993 | Samachisa et al. |
| 5,276,649 A | 1/1994 | Hoshita et al. |
| 5,287,469 A | 2/1994 | Tsuboi |
| 5,365,484 A | 11/1994 | Cleveland et al. |
| 5,388,064 A | 2/1995 | Khan |
| 5,416,646 A | 5/1995 | Shirai |
| 5,416,782 A | 5/1995 | Wells et al. |
| 5,446,854 A | 8/1995 | Khalidi et al. |
| 5,450,424 A | 9/1995 | Okugaki et al. |
| 5,469,444 A | 11/1995 | Endoh et al. |
| 5,473,753 A | 12/1995 | Wells et al. |
| 5,479,170 A | 12/1995 | Cauwenberghs et al. |
| 5,508,958 A | 4/1996 | Fazio et al. |
| 5,519,831 A | 5/1996 | Holzhammer |
| 5,532,962 A | 7/1996 | Auclair et al. |
| 5,533,190 A | 7/1996 | Binford et al. |
| 5,541,886 A | 7/1996 | Hasbun |
| 5,600,677 A | 2/1997 | Citta et al. |
| 5,638,320 A | 6/1997 | Wong et al. |
| 5,657,332 A | 8/1997 | Auclair et al. |
| 5,675,540 A | 10/1997 | Roohparvar |
| 5,682,352 A | 10/1997 | Wong et al. |
| 5,687,114 A | 11/1997 | Khan |
| 5,696,717 A | 12/1997 | Koh |
| 5,726,649 A | 3/1998 | Tamaru et al. |
| 5,726,934 A | 3/1998 | Tran et al. |
| 5,742,752 A | 4/1998 | De Koening |
| 5,748,533 A | 5/1998 | Dunlap et al. |
| 5,748,534 A | 5/1998 | Dunlap et al. |
| 5,751,637 A | 5/1998 | Chen et al. |
| 5,761,402 A | 6/1998 | Kaneda et al. |
| 5,798,966 A | 8/1998 | Keeney |
| 5,799,200 A | 8/1998 | Brant et al. |
| 5,801,985 A | 9/1998 | Roohparvar et al. |
| 5,838,832 A | 11/1998 | Barnsley |
| 5,860,106 A | 1/1999 | Domen et al. |
| 5,867,114 A | 2/1999 | Barbir |
| 5,867,428 A | 2/1999 | Ishii et al. |
| 5,867,429 A | 2/1999 | Chen et al. |
| 5,877,986 A | 3/1999 | Harari et al. |
| 5,889,937 A | 3/1999 | Tamagawa |
| 5,901,089 A | 5/1999 | Korsh et al. |
| 5,909,449 A | 6/1999 | So et al. |
| 5,912,906 A | 6/1999 | Wu et al. |
| 5,930,167 A | 7/1999 | Lee et al. |
| 5,937,424 A | 8/1999 | Leak et al. |
| 5,942,004 A | 8/1999 | Cappelletti |
| 5,946,716 A | 8/1999 | Karp et al. |
| 5,969,986 A | 10/1999 | Wong et al. |
| 5,982,668 A | 11/1999 | Ishii et al. |
| 5,991,517 A | 11/1999 | Harari et al. |
| 5,995,417 A | 11/1999 | Chen et al. |
| 6,009,014 A | 12/1999 | Hollmer et al. |
| 6,009,016 A | 12/1999 | Ishii et al. |
| 6,023,425 A | 2/2000 | Ishii et al. |
| 6,034,891 A | 3/2000 | Norman |
| 6,040,993 A | 3/2000 | Chen et al. |
| 6,041,430 A | 3/2000 | Yamauchi |
| 6,073,204 A | 6/2000 | Lakhani et al. |
| 6,101,614 A | 8/2000 | Gonzales et al. |
| 6,128,237 A | 10/2000 | Shirley et al. |
| 6,134,140 A | 10/2000 | Tanaka et al. |
| 6,134,143 A | 10/2000 | Norman |
| 6,134,631 A | 10/2000 | Jennings |
| 6,141,261 A | 10/2000 | Patti |
| 6,151,246 A | 11/2000 | So et al. |
| 6,157,573 A | 12/2000 | Ishii et al. |
| 6,166,962 A | 12/2000 | Chen et al. |
| 6,169,691 B1 | 1/2001 | Pasotti et al. |
| 6,178,466 B1 | 1/2001 | Gilbertson et al. |
| 6,185,134 B1 | 2/2001 | Tanaka et al. |
| 6,209,113 B1 | 3/2001 | Roohparvar |
| 6,212,654 B1 | 4/2001 | Lou et al. |
| 6,219,276 B1 | 4/2001 | Parker |
| 6,219,447 B1 | 4/2001 | Lee et al. |
| 6,222,762 B1 | 4/2001 | Guterman et al. |
| 6,230,233 B1 | 5/2001 | Lofgren et al. |
| 6,240,458 B1 | 5/2001 | Gilbertson |
| 6,259,627 B1 | 7/2001 | Wong |
| 6,275,419 B1 | 8/2001 | Guterman et al. |
| 6,278,632 B1 | 8/2001 | Chevallier |
| 6,279,069 B1 | 8/2001 | Robinson et al. |
| 6,288,944 B1 | 9/2001 | Kawamura |
| 6,292,394 B1 | 9/2001 | Cohen et al. |
| 6,301,151 B1 | 10/2001 | Engh et al. |
| 6,304,486 B1 | 10/2001 | Yano |
| 6,307,776 B1 | 10/2001 | So et al. |
| 6,314,044 B1 | 11/2001 | Sasaki et al. |
| 6,317,363 B1 | 11/2001 | Guterman et al. |
| 6,317,364 B1 | 11/2001 | Guterman et al. |
| 6,345,004 B1 | 2/2002 | Omura et al. |
| 6,360,346 B1 | 3/2002 | Miyauchi et al. |
| 6,363,008 B1 | 3/2002 | Wong |
| 6,363,454 B1 | 3/2002 | Lakhani et al. |
| 6,366,496 B1 | 4/2002 | Torelli et al. |
| 6,385,092 B1 | 5/2002 | Ishii et al. |
| 6,392,932 B1 | 5/2002 | Ishii et al. |
| 6,396,742 B1 | 5/2002 | Korsh et al. |
| 6,397,364 B1 | 5/2002 | Barkan |
| 6,405,323 B1 | 6/2002 | Lin et al. |
| 6,405,342 B1 | 6/2002 | Lee |
| 6,418,060 B1 | 7/2002 | Yong et al. |
| 6,442,585 B1 | 8/2002 | Dean et al. |
| 6,445,602 B1 | 9/2002 | Kokudo et al. |
| 6,452,838 B1 | 9/2002 | Ishii et al. |
| 6,456,528 B1 | 9/2002 | Chen |
| 6,466,476 B1 | 10/2002 | Wong et al. |
| 6,467,062 B1 | 10/2002 | Barkan |
| 6,469,931 B1 | 10/2002 | Ban et al. |
| 6,480,948 B1 | 11/2002 | Virajpet et al. |
| 6,490,236 B1 | 12/2002 | Fukuda et al. |
| 6,522,580 B2 | 2/2003 | Chen et al. |
| 6,525,952 B2 | 2/2003 | Araki et al. |
| 6,532,556 B1 | 3/2003 | Wong et al. |
| 6,538,922 B1 | 3/2003 | Khalid et al. |
| 6,549,464 B2 | 4/2003 | Tanaka et al. |
| 6,553,510 B1 | 4/2003 | Pekny et al. |
| 6,558,967 B1 | 5/2003 | Wong |
| 6,560,152 B1 | 5/2003 | Cernea |
| 6,567,311 B2 | 5/2003 | Ishii et al. |
| 6,577,539 B2 | 6/2003 | Iwahashi |
| 6,584,012 B2 | 6/2003 | Banks |
| 6,615,307 B1 | 9/2003 | Roohparvar |
| 6,621,739 B2 | 9/2003 | Gonzalez et al. |
| 6,640,326 B1 | 10/2003 | Buckingham et al. |
| 6,643,169 B2 | 11/2003 | Rudelic et al. |
| 6,646,913 B2 | 11/2003 | Micheloni et al. |
| 6,678,192 B2 | 1/2004 | Gongwer et al. |
| 6,683,811 B2 | 1/2004 | Ishii et al. |
| 6,687,155 B2 | 2/2004 | Nagasue |
| 6,707,748 B2 | 3/2004 | Lin et al. |
| 6,708,257 B2 | 3/2004 | Bao |
| 6,714,449 B2 | 3/2004 | Khalid |
| 6,717,847 B2 | 4/2004 | Chen |
| 6,731,557 B2 | 5/2004 | Beretta |
| 6,732,250 B2 | 5/2004 | Durrant |
| 6,738,293 B1 | 5/2004 | Iwahashi |
| 6,751,766 B2 | 6/2004 | Guterman et al. |
| 6,757,193 B2 | 6/2004 | Chen et al. |
| 6,774,808 B1 | 8/2004 | Hibbs et al. |
| 6,781,877 B2 | 8/2004 | Cernea et al. |

(56) References Cited

U.S. PATENT DOCUMENTS

| | | |
|---|---|---|
| 6,804,805 B2 | 10/2004 | Rub |
| 6,807,095 B2 | 10/2004 | Chen et al. |
| 6,807,101 B2 | 10/2004 | Ooishi et al. |
| 6,809,964 B2 | 10/2004 | Moschopoulos et al. |
| 6,819,592 B2 | 11/2004 | Noguchi et al. |
| 6,829,167 B2 | 12/2004 | Tu et al. |
| 6,845,052 B1 | 1/2005 | Ho et al. |
| 6,851,018 B2 | 2/2005 | Wyatt et al. |
| 6,851,081 B2 | 2/2005 | Yamamoto |
| 6,856,546 B2 | 2/2005 | Guterman et al. |
| 6,862,218 B2 | 3/2005 | Guterman et al. |
| 6,870,767 B2 | 3/2005 | Rudelic et al. |
| 6,870,773 B2 | 3/2005 | Noguchi et al. |
| 6,873,552 B2 | 3/2005 | Ishii et al. |
| 6,879,520 B2 | 4/2005 | Hosono et al. |
| 6,882,567 B1 | 4/2005 | Wong |
| 6,894,926 B2 | 5/2005 | Guterman et al. |
| 6,907,497 B2 | 6/2005 | Hosono et al. |
| 6,925,009 B2 | 8/2005 | Noguchi et al. |
| 6,930,925 B2 | 8/2005 | Guo et al. |
| 6,934,188 B2 | 8/2005 | Roohparvar |
| 6,937,511 B2 | 8/2005 | Hsu et al. |
| 6,958,938 B2 | 10/2005 | Noguchi et al. |
| 6,963,505 B2 | 11/2005 | Cohen |
| 6,972,993 B2 | 12/2005 | Conley et al. |
| 6,988,175 B2 | 1/2006 | Lasser |
| 6,992,932 B2 | 1/2006 | Cohen |
| 6,999,344 B2 | 2/2006 | Hosono et al. |
| 7,002,843 B2 | 2/2006 | Guterman et al. |
| 7,006,379 B2 | 2/2006 | Noguchi et al. |
| 7,012,835 B2 | 3/2006 | Gonzales et al. |
| 7,020,017 B2 | 3/2006 | Chen et al. |
| 7,023,735 B2 | 4/2006 | Ban et al. |
| 7,031,210 B2 | 4/2006 | Park et al. |
| 7,031,214 B2 | 4/2006 | Tran |
| 7,031,216 B2 | 4/2006 | You |
| 7,039,846 B2 | 5/2006 | Hewitt et al. |
| 7,042,766 B1 | 5/2006 | Wang et al. |
| 7,054,193 B1 | 5/2006 | Wong |
| 7,054,199 B2 | 5/2006 | Lee et al. |
| 7,057,958 B2 | 6/2006 | So et al. |
| 7,065,147 B2 | 6/2006 | Ophir et al. |
| 7,068,539 B2 | 6/2006 | Guterman et al. |
| 7,071,849 B2 | 7/2006 | Zhang |
| 7,072,222 B2 | 7/2006 | Ishii et al. |
| 7,079,555 B2 | 7/2006 | Baydar et al. |
| 7,088,615 B2 | 8/2006 | Guterman et al. |
| 7,099,194 B2 | 8/2006 | Tu et al. |
| 7,102,924 B2 | 9/2006 | Chen et al. |
| 7,113,432 B2 | 9/2006 | Mokhlesi |
| 7,130,210 B2 | 10/2006 | Bathul et al. |
| 7,139,192 B1 | 11/2006 | Wong |
| 7,139,198 B2 | 11/2006 | Guterman et al. |
| 7,145,805 B2 | 12/2006 | Ishii et al. |
| 7,151,692 B2 | 12/2006 | Wu |
| 7,158,058 B1 | 1/2007 | Yu |
| 7,170,781 B2 | 1/2007 | So et al. |
| 7,170,802 B2 | 1/2007 | Cernea et al. |
| 7,173,859 B2 | 2/2007 | Hemink |
| 7,177,184 B2 | 2/2007 | Chen |
| 7,177,195 B2 | 2/2007 | Gonzalez et al. |
| 7,177,199 B2 | 2/2007 | Chen et al. |
| 7,177,200 B2 | 2/2007 | Ronen et al. |
| 7,184,338 B2 | 2/2007 | Nakagawa et al. |
| 7,187,195 B2 | 3/2007 | Kim |
| 7,187,592 B2 | 3/2007 | Guterman et al. |
| 7,190,614 B2 | 3/2007 | Wu |
| 7,193,898 B2 | 3/2007 | Cernea |
| 7,193,921 B2 | 3/2007 | Choi et al. |
| 7,196,644 B1 | 3/2007 | Anderson et al. |
| 7,196,928 B2 | 3/2007 | Chen |
| 7,196,933 B2 | 3/2007 | Shibata |
| 7,197,594 B2 | 3/2007 | Raz et al. |
| 7,200,062 B2 | 4/2007 | Kinsely et al. |
| 7,210,077 B2 | 4/2007 | Brandenberger et al. |
| 7,221,592 B2 | 5/2007 | Nazarian |
| 7,224,613 B2 | 5/2007 | Chen et al. |
| 7,231,474 B1 | 6/2007 | Helms et al. |
| 7,231,562 B2 | 6/2007 | Ohlhoff et al. |
| 7,243,275 B2 | 7/2007 | Gongwer et al. |
| 7,254,690 B2 | 8/2007 | Rao |
| 7,254,763 B2 | 8/2007 | Aadsen et al. |
| 7,257,027 B2 | 8/2007 | Park |
| 7,259,987 B2 | 8/2007 | Chen et al. |
| 7,266,026 B2 | 9/2007 | Gongwer et al. |
| 7,266,069 B2 | 9/2007 | Chu |
| 7,269,066 B2 | 9/2007 | Nguyen et al. |
| 7,272,757 B2 | 9/2007 | Stocken |
| 7,274,611 B2 | 9/2007 | Roohparvar |
| 7,277,355 B2 | 10/2007 | Tanzana |
| 7,280,398 B1 | 10/2007 | Lee et al. |
| 7,280,409 B2 | 10/2007 | Misumi et al. |
| 7,280,415 B2 | 10/2007 | Hwang et al. |
| 7,283,399 B2 | 10/2007 | Ishii et al. |
| 7,289,344 B2 | 10/2007 | Chen |
| 7,301,807 B2 | 11/2007 | Khalid et al. |
| 7,301,817 B2 | 11/2007 | Li et al. |
| 7,308,525 B2 | 12/2007 | Lasser et al. |
| 7,310,255 B2 | 12/2007 | Chan |
| 7,310,269 B2 | 12/2007 | Shibata |
| 7,310,271 B2 | 12/2007 | Lee |
| 7,310,272 B1 | 12/2007 | Mokhlesi et al. |
| 7,310,347 B2 | 12/2007 | Lasser |
| 7,312,727 B1 | 12/2007 | Feng et al. |
| 7,321,509 B2 | 1/2008 | Chen et al. |
| 7,328,384 B1 | 2/2008 | Kulkarni et al. |
| 7,342,831 B2 | 3/2008 | Mokhlesi et al. |
| 7,343,330 B1 | 3/2008 | Boesjes et al. |
| 7,345,924 B2 | 3/2008 | Nguyen et al. |
| 7,345,928 B2 | 3/2008 | Li |
| 7,349,263 B2 | 3/2008 | Kim et al. |
| 7,356,755 B2 | 4/2008 | Fackenthal |
| 7,363,420 B2 | 4/2008 | Lin et al. |
| 7,365,671 B1 | 4/2008 | Anderson |
| 7,388,781 B2 | 6/2008 | Litsyn et al. |
| 7,397,697 B2 | 7/2008 | So et al. |
| 7,405,974 B2 | 7/2008 | Yaoi et al. |
| 7,405,979 B2 | 7/2008 | Ishii et al. |
| 7,408,804 B2 | 8/2008 | Hemink et al. |
| 7,408,810 B2 | 8/2008 | Aritome et al. |
| 7,409,473 B2 | 8/2008 | Conley et al. |
| 7,409,623 B2 | 8/2008 | Baker et al. |
| 7,420,847 B2 | 9/2008 | Li |
| 7,433,231 B2 | 10/2008 | Aritome |
| 7,433,697 B2 | 10/2008 | Karaoguz et al. |
| 7,434,111 B2 | 10/2008 | Sugiura et al. |
| 7,437,498 B2 | 10/2008 | Ronen |
| 7,440,324 B2 | 10/2008 | Mokhlesi |
| 7,440,331 B2 | 10/2008 | Hemink |
| 7,441,067 B2 | 10/2008 | Gorobetz et al. |
| 7,447,970 B2 | 11/2008 | Wu et al. |
| 7,450,421 B2 | 11/2008 | Mokhlesi et al. |
| 7,453,737 B2 | 11/2008 | Ha |
| 7,457,163 B2 | 11/2008 | Hemink |
| 7,457,897 B1 | 11/2008 | Lee et al. |
| 7,460,410 B2 | 12/2008 | Nagai et al. |
| 7,460,412 B2 | 12/2008 | Lee et al. |
| 7,466,592 B2 | 12/2008 | Mitani et al. |
| 7,468,907 B2 | 12/2008 | Kang et al. |
| 7,468,911 B2 | 12/2008 | Lutze et al. |
| 7,469,049 B1 | 12/2008 | Feng |
| 7,471,581 B2 | 12/2008 | Tran et al. |
| 7,483,319 B2 | 1/2009 | Brown |
| 7,487,329 B2 | 2/2009 | Hepkin et al. |
| 7,487,394 B2 | 2/2009 | Forhan et al. |
| 7,492,641 B2 | 2/2009 | Hosono et al. |
| 7,508,710 B2 | 3/2009 | Mokhlesi |
| 7,526,711 B2 | 4/2009 | Orio |
| 7,539,061 B2 | 5/2009 | Lee |
| 7,539,062 B2 | 5/2009 | Doyle |
| 7,551,492 B2 | 6/2009 | Kim |
| 7,558,109 B2 | 7/2009 | Brandman et al. |
| 7,558,839 B1 | 7/2009 | McGovern |
| 7,568,135 B2 | 7/2009 | Cornwell et al. |

(56) References Cited

U.S. PATENT DOCUMENTS

| | | | |
|---|---|---|---|
| 7,570,520 B2 | 8/2009 | Kamei et al. | |
| 7,574,555 B2 | 8/2009 | Porat et al. | |
| 7,590,002 B2 | 9/2009 | Mokhlesi et al. | |
| 7,593,259 B2 | 9/2009 | Kim | |
| 7,593,263 B2 * | 9/2009 | Sokolov et al. | 365/185.17 |
| 7,594,093 B1 | 9/2009 | Kancherla | |
| 7,596,707 B1 | 9/2009 | Vemula | |
| 7,609,787 B2 | 10/2009 | Jahan et al. | |
| 7,613,043 B2 | 11/2009 | Cornwell et al. | |
| 7,616,498 B2 | 11/2009 | Mokhlesi et al. | |
| 7,619,918 B2 | 11/2009 | Aritome | |
| 7,631,245 B2 | 12/2009 | Lasser | |
| 7,633,798 B2 | 12/2009 | Sarin et al. | |
| 7,633,802 B2 | 12/2009 | Mokhlesi | |
| 7,639,532 B2 | 12/2009 | Roohparvar et al. | |
| 7,644,347 B2 | 1/2010 | Alexander et al. | |
| 7,656,734 B2 | 2/2010 | Thorp et al. | |
| 7,660,158 B2 | 2/2010 | Aritome | |
| 7,660,183 B2 | 2/2010 | Ware et al. | |
| 7,661,000 B2 | 2/2010 | Ueda et al. | |
| 7,661,054 B2 | 2/2010 | Huffman et al. | |
| 7,665,007 B2 | 2/2010 | Yang et al. | |
| 7,680,987 B1 | 3/2010 | Clark et al. | |
| 7,706,182 B2 * | 4/2010 | Shalvi et al. | 365/185.03 |
| 7,733,712 B1 | 6/2010 | Walston et al. | |
| 7,742,351 B2 | 6/2010 | Inoue et al. | |
| 7,761,624 B2 | 7/2010 | Karamcheti et al. | |
| 7,797,609 B2 | 9/2010 | Neuman | |
| 7,810,017 B2 | 10/2010 | Radke | |
| 7,848,149 B2 | 12/2010 | Gonzalez et al. | |
| 7,869,273 B2 | 1/2011 | Lee et al. | |
| 7,885,119 B2 | 2/2011 | Li | |
| 7,904,783 B2 | 3/2011 | Brandman et al. | |
| 7,924,613 B1 | 4/2011 | Sommer | |
| 7,925,936 B1 | 4/2011 | Sommer | |
| 7,928,497 B2 | 4/2011 | Yaegashi | |
| 7,929,549 B1 | 4/2011 | Talbot | |
| 7,930,515 B2 | 4/2011 | Gupta et al. | |
| 7,945,825 B2 | 5/2011 | Cohen et al. | |
| 7,975,192 B2 * | 7/2011 | Sommer et al. | 714/719 |
| 7,978,516 B2 | 7/2011 | Olbrich et al. | |
| 8,014,094 B1 | 9/2011 | Jin | |
| 8,037,380 B2 | 10/2011 | Cagno et al. | |
| 8,040,744 B2 | 10/2011 | Gorobets et al. | |
| 8,065,583 B2 | 11/2011 | Radke | |
| 8,156,403 B2 * | 4/2012 | Shalvi et al. | 714/764 |
| 8,239,735 B2 * | 8/2012 | Shalvi et al. | 714/774 |
| 2001/0002172 A1 | 5/2001 | Tanaka et al. | |
| 2001/0006479 A1 | 7/2001 | Ikehashi et al. | |
| 2002/0038440 A1 | 3/2002 | Barkan | |
| 2002/0056064 A1 | 5/2002 | Kidorf et al. | |
| 2002/0118574 A1 | 8/2002 | Gongwer et al. | |
| 2002/0133684 A1 | 9/2002 | Anderson | |
| 2002/0166091 A1 | 11/2002 | Kidorf et al. | |
| 2002/0174295 A1 | 11/2002 | Ulrich et al. | |
| 2002/0196510 A1 | 12/2002 | Hietala et al. | |
| 2003/0002348 A1 | 1/2003 | Chen et al. | |
| 2003/0103400 A1 | 6/2003 | Van Tran | |
| 2003/0161183 A1 | 8/2003 | Van Tran | |
| 2003/0189856 A1 | 10/2003 | Cho et al. | |
| 2004/0057265 A1 | 3/2004 | Mirabel et al. | |
| 2004/0057285 A1 | 3/2004 | Cernea et al. | |
| 2004/0083333 A1 | 4/2004 | Chang et al. | |
| 2004/0083334 A1 | 4/2004 | Chang et al. | |
| 2004/0105311 A1 | 6/2004 | Cernea et al. | |
| 2004/0114437 A1 | 6/2004 | Li | |
| 2004/0160842 A1 | 8/2004 | Fukiage | |
| 2004/0223371 A1 | 11/2004 | Roohparvar | |
| 2005/0007802 A1 | 1/2005 | Gerpheide | |
| 2005/0013165 A1 | 1/2005 | Ban | |
| 2005/0024941 A1 | 2/2005 | Lasser et al. | |
| 2005/0024978 A1 | 2/2005 | Ronen | |
| 2005/0030788 A1 | 2/2005 | Parkinson et al. | |
| 2005/0086574 A1 | 4/2005 | Fackenthal | |
| 2005/0121436 A1 | 6/2005 | Kamitani et al. | |
| 2005/0144361 A1 | 6/2005 | Gonzalez et al. | |
| 2005/0157555 A1 | 7/2005 | Ono et al. | |
| 2005/0162913 A1 | 7/2005 | Chen | |
| 2005/0169051 A1 | 8/2005 | Khalid et al. | |
| 2005/0189649 A1 | 9/2005 | Maruyama et al. | |
| 2005/0213393 A1 | 9/2005 | Lasser | |
| 2005/0224853 A1 | 10/2005 | Ohkawa | |
| 2005/0240745 A1 | 10/2005 | Iyer et al. | |
| 2005/0243626 A1 | 11/2005 | Ronen | |
| 2006/0004952 A1 | 1/2006 | Lasser | |
| 2006/0028875 A1 | 2/2006 | Avraham et al. | |
| 2006/0028877 A1 | 2/2006 | Meir | |
| 2006/0101193 A1 | 5/2006 | Murin | |
| 2006/0106972 A1 | 5/2006 | Gorobets et al. | |
| 2006/0107136 A1 | 5/2006 | Gongwer et al. | |
| 2006/0129750 A1 | 6/2006 | Lee et al. | |
| 2006/0133141 A1 | 6/2006 | Gorobets | |
| 2006/0156189 A1 | 7/2006 | Tomlin | |
| 2006/0179334 A1 | 8/2006 | Brittain et al. | |
| 2006/0190699 A1 | 8/2006 | Lee | |
| 2006/0203546 A1 | 9/2006 | Lasser | |
| 2006/0218359 A1 | 9/2006 | Sanders et al. | |
| 2006/0221692 A1 | 10/2006 | Chen | |
| 2006/0221705 A1 | 10/2006 | Hemink et al. | |
| 2006/0221714 A1 | 10/2006 | Li et al. | |
| 2006/0239077 A1 | 10/2006 | Park et al. | |
| 2006/0239081 A1 | 10/2006 | Roohparvar | |
| 2006/0256620 A1 | 11/2006 | Nguyen et al. | |
| 2006/0256626 A1 | 11/2006 | Werner et al. | |
| 2006/0256891 A1 | 11/2006 | Yuan et al. | |
| 2006/0271748 A1 | 11/2006 | Jain et al. | |
| 2006/0285392 A1 | 12/2006 | Incarnati et al. | |
| 2006/0285396 A1 | 12/2006 | Ha | |
| 2007/0006013 A1 | 1/2007 | Moshayedi et al. | |
| 2007/0019481 A1 | 1/2007 | Park | |
| 2007/0033581 A1 | 2/2007 | Tomlin et al. | |
| 2007/0047314 A1 | 3/2007 | Goda et al. | |
| 2007/0047326 A1 | 3/2007 | Nguyen et al. | |
| 2007/0050536 A1 | 3/2007 | Kolokowsky | |
| 2007/0058446 A1 | 3/2007 | Hwang et al. | |
| 2007/0061502 A1 | 3/2007 | Lasser et al. | |
| 2007/0067667 A1 | 3/2007 | Ikeuchi et al. | |
| 2007/0074093 A1 | 3/2007 | Lasser | |
| 2007/0086239 A1 | 4/2007 | Litsyn et al. | |
| 2007/0086260 A1 | 4/2007 | Sinclair | |
| 2007/0089034 A1 | 4/2007 | Litsyn et al. | |
| 2007/0091677 A1 | 4/2007 | Lasser et al. | |
| 2007/0091694 A1 | 4/2007 | Lee et al. | |
| 2007/0103978 A1 | 5/2007 | Conley et al. | |
| 2007/0103986 A1 | 5/2007 | Chen | |
| 2007/0104211 A1 | 5/2007 | Opsasnick | |
| 2007/0109845 A1 | 5/2007 | Chen | |
| 2007/0109849 A1 | 5/2007 | Chen | |
| 2007/0115726 A1 | 5/2007 | Cohen et al. | |
| 2007/0118713 A1 | 5/2007 | Guterman et al. | |
| 2007/0143378 A1 | 6/2007 | Gorobetz | |
| 2007/0143531 A1 | 6/2007 | Atri | |
| 2007/0159889 A1 | 7/2007 | Kang et al. | |
| 2007/0159892 A1 | 7/2007 | Kang et al. | |
| 2007/0159907 A1 | 7/2007 | Kwak | |
| 2007/0168837 A1 | 7/2007 | Murin | |
| 2007/0171714 A1 | 7/2007 | Wu et al. | |
| 2007/0183210 A1 | 8/2007 | Choi et al. | |
| 2007/0189073 A1 | 8/2007 | Aritome | |
| 2007/0195602 A1 | 8/2007 | Fong et al. | |
| 2007/0206426 A1 | 9/2007 | Mokhlesi | |
| 2007/0208904 A1 | 9/2007 | Hsieh et al. | |
| 2007/0226599 A1 | 9/2007 | Motwani | |
| 2007/0236990 A1 | 10/2007 | Aritome | |
| 2007/0253249 A1 | 11/2007 | Kang et al. | |
| 2007/0256620 A1 | 11/2007 | Viggiano et al. | |
| 2007/0263455 A1 | 11/2007 | Cornwell et al. | |
| 2007/0266232 A1 | 11/2007 | Rodgers et al. | |
| 2007/0271424 A1 | 11/2007 | Lee et al. | |
| 2007/0280000 A1 | 12/2007 | Fujiu et al. | |
| 2007/0291571 A1 | 12/2007 | Balasundaram | |
| 2007/0297234 A1 | 12/2007 | Cernea et al. | |
| 2008/0010395 A1 | 1/2008 | Mylly et al. | |
| 2008/0025121 A1 | 1/2008 | Tanzawa | |

(56) References Cited

U.S. PATENT DOCUMENTS

| | | |
|---|---|---|
| 2008/0043535 A1 | 2/2008 | Roohparvar |
| 2008/0049504 A1 | 2/2008 | Kasahara et al. |
| 2008/0049506 A1 | 2/2008 | Guterman |
| 2008/0052446 A1 | 2/2008 | Lasser et al. |
| 2008/0055993 A1 | 3/2008 | Lee |
| 2008/0080243 A1 | 4/2008 | Edahiro et al. |
| 2008/0082730 A1 | 4/2008 | Kim et al. |
| 2008/0089123 A1 | 4/2008 | Chae et al. |
| 2008/0104309 A1 | 5/2008 | Cheon et al. |
| 2008/0104312 A1 | 5/2008 | Lasser |
| 2008/0109590 A1 | 5/2008 | Jung et al. |
| 2008/0115017 A1 | 5/2008 | Jacobson |
| 2008/0123420 A1 | 5/2008 | Brandman et al. |
| 2008/0123426 A1 | 5/2008 | Lutze et al. |
| 2008/0126686 A1 | 5/2008 | Sokolov et al. |
| 2008/0130341 A1* | 6/2008 | Shalvi et al. ............ 365/45 |
| 2008/0148115 A1 | 6/2008 | Sokolov et al. |
| 2008/0151618 A1 | 6/2008 | Sharon et al. |
| 2008/0151667 A1 | 6/2008 | Miu et al. |
| 2008/0158958 A1* | 7/2008 | Sokolov et al. ...... 365/185.08 |
| 2008/0181001 A1 | 7/2008 | Shalvi |
| 2008/0198650 A1 | 8/2008 | Shalvi et al. |
| 2008/0198654 A1 | 8/2008 | Toda |
| 2008/0209116 A1 | 8/2008 | Caulkins |
| 2008/0209304 A1 | 8/2008 | Winarski et al. |
| 2008/0215798 A1 | 9/2008 | Sharon et al. |
| 2008/0219050 A1 | 9/2008 | Shalvi et al. |
| 2008/0239093 A1 | 10/2008 | Easwar et al. |
| 2008/0239812 A1 | 10/2008 | Abiko et al. |
| 2008/0253188 A1 | 10/2008 | Aritome |
| 2008/0263262 A1 | 10/2008 | Sokolov et al. |
| 2008/0263676 A1 | 10/2008 | Mo et al. |
| 2008/0270730 A1 | 10/2008 | Lasser et al. |
| 2008/0282106 A1 | 11/2008 | Shalvi et al. |
| 2008/0288714 A1 | 11/2008 | Salomon et al. |
| 2009/0013233 A1 | 1/2009 | Radke |
| 2009/0024905 A1 | 1/2009 | Shalvi et al. |
| 2009/0034337 A1 | 2/2009 | Aritome |
| 2009/0040840 A1* | 2/2009 | Lee ................ 365/189.11 |
| 2009/0043831 A1 | 2/2009 | Antonopoulos et al. |
| 2009/0043951 A1 | 2/2009 | Shalvi et al. |
| 2009/0049234 A1 | 2/2009 | Oh et al. |
| 2009/0073762 A1 | 3/2009 | Lee et al. |
| 2009/0086542 A1 | 4/2009 | Lee et al. |
| 2009/0089484 A1 | 4/2009 | Chu |
| 2009/0091979 A1 | 4/2009 | Shalvi |
| 2009/0094930 A1 | 4/2009 | Schwoerer |
| 2009/0106485 A1 | 4/2009 | Anholt |
| 2009/0112949 A1 | 4/2009 | Ergan et al. |
| 2009/0132755 A1 | 5/2009 | Radke |
| 2009/0144600 A1 | 6/2009 | Perlmutter et al. |
| 2009/0150894 A1 | 6/2009 | Huang et al. |
| 2009/0157950 A1 | 6/2009 | Selinger |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0172257 A1 | 7/2009 | Prins et al. |
| 2009/0172261 A1 | 7/2009 | Prins et al. |
| 2009/0193184 A1 | 7/2009 | Yu et al. |
| 2009/0199074 A1 | 8/2009 | Sommer et al. |
| 2009/0204824 A1 | 8/2009 | Lin et al. |
| 2009/0204872 A1 | 8/2009 | Yu et al. |
| 2009/0213653 A1 | 8/2009 | Perlmutter et al. |
| 2009/0213654 A1 | 8/2009 | Perlmutter et al. |
| 2009/0225595 A1 | 9/2009 | Kim |
| 2009/0228761 A1 | 9/2009 | Perlmutter et al. |
| 2009/0240872 A1 | 9/2009 | Perlmutter et al. |
| 2009/0265509 A1 | 10/2009 | Klein |
| 2009/0300227 A1 | 12/2009 | Nochimowski et al. |
| 2009/0323412 A1 | 12/2009 | Mokhlesi et al. |
| 2009/0327608 A1 | 12/2009 | Eschmann |
| 2010/0017650 A1 | 1/2010 | Chin et al. |
| 2010/0034022 A1 | 2/2010 | Dutta et al. |
| 2010/0057976 A1 | 3/2010 | Lasser |
| 2010/0061151 A1 | 3/2010 | Miwa et al. |
| 2010/0082883 A1 | 4/2010 | Chen et al. |
| 2010/0083247 A1 | 4/2010 | Kanevsky et al. |
| 2010/0110580 A1 | 5/2010 | Takashima |
| 2010/0124088 A1 | 5/2010 | Shalvi et al. |
| 2010/0131697 A1 | 5/2010 | Alrod et al. |
| 2010/0131827 A1 | 5/2010 | Sokolov et al. |
| 2010/0142268 A1 | 6/2010 | Aritome |
| 2010/0142277 A1 | 6/2010 | Yang et al. |
| 2010/0157675 A1 | 6/2010 | Shalvi et al. |
| 2010/0165689 A1 | 7/2010 | Rotbard et al. |
| 2010/0169547 A1 | 7/2010 | Ou |
| 2010/0169743 A1 | 7/2010 | Vogan et al. |
| 2010/0174847 A1 | 7/2010 | Paley et al. |
| 2010/0195390 A1 | 8/2010 | Shalvi |
| 2010/0199150 A1 | 8/2010 | Shalvi et al. |
| 2010/0211803 A1 | 8/2010 | Lablans |
| 2010/0214844 A1* | 8/2010 | Lee et al. ................ 365/185.18 |
| 2010/0220509 A1 | 9/2010 | Sokolov et al. |
| 2010/0220510 A1 | 9/2010 | Shalvi |
| 2010/0250836 A1 | 9/2010 | Sokolov et al. |
| 2010/0287217 A1 | 11/2010 | Borchers et al. |
| 2010/0329022 A1* | 12/2010 | Baik et al. ................ 365/185.19 |
| 2011/0010489 A1 | 1/2011 | Yeh |
| 2011/0060969 A1 | 3/2011 | Ramamoorthy et al. |
| 2011/0066793 A1 | 3/2011 | Burd |
| 2011/0075482 A1 | 3/2011 | Shepard et al. |
| 2011/0107049 A1 | 5/2011 | Kwon et al. |
| 2011/0149657 A1 | 6/2011 | Haratsch et al. |
| 2011/0199823 A1 | 8/2011 | Bar-Or et al. |
| 2011/0302354 A1 | 12/2011 | Miller |
| 2012/0081959 A1* | 4/2012 | Lee et al. ................ 365/185.09 |

FOREIGN PATENT DOCUMENTS

| | | |
|---|---|---|
| WO | 03100791 A1 | 12/2003 |
| WO | 2007046084 A2 | 4/2007 |
| WO | 2007132452 A2 | 11/2007 |
| WO | 2007132453 A2 | 11/2007 |
| WO | 2007132456 A2 | 11/2007 |
| WO | 2007132457 A2 | 11/2007 |
| WO | 2007132458 A2 | 11/2007 |
| WO | 2007146010 A2 | 12/2007 |
| WO | 2008026203 A2 | 3/2008 |
| WO | 2008053472 A2 | 5/2008 |
| WO | 2008053473 A2 | 5/2008 |
| WO | 2008068747 A2 | 6/2008 |
| WO | 2008077284 A1 | 7/2008 |
| WO | 2008083131 A2 | 7/2008 |
| WO | 2008099958 A1 | 8/2008 |
| WO | 2008111058 A2 | 9/2008 |
| WO | 2008124760 A2 | 10/2008 |
| WO | 2008139441 A2 | 11/2008 |
| WO | 2009037691 A2 | 3/2009 |
| WO | 2009037697 A2 | 3/2009 |
| WO | 2009038961 A2 | 3/2009 |
| WO | 2009050703 A2 | 4/2009 |
| WO | 2009053961 A2 | 4/2009 |
| WO | 2009053962 A2 | 4/2009 |
| WO | 2009053963 A2 | 4/2009 |
| WO | 2009063450 A2 | 5/2009 |
| WO | 2009072100 A2 | 6/2009 |
| WO | 2009072101 A2 | 6/2009 |
| WO | 2009072102 A2 | 6/2009 |
| WO | 2009072103 A2 | 6/2009 |
| WO | 2009072104 A2 | 6/2009 |
| WO | 2009072105 A2 | 6/2009 |
| WO | 2009074978 A2 | 6/2009 |
| WO | 2009074979 A2 | 6/2009 |
| WO | 2009078006 A2 | 6/2009 |
| WO | 2009095902 A2 | 8/2009 |
| WO | 2011024015 A1 | 3/2011 |

OTHER PUBLICATIONS

Ankolekar et al., "Multibit Error-Correction Methods for Latency-Constrained Flash Memory Systems", IEEE Transactions on Device and Materials Reliability, vol. 10, No. 1, pp. 33-39, Mar. 2010.

(56) References Cited

OTHER PUBLICATIONS

Berman et al., "Mitigating Inter-Cell Coupling Effects in MLC NAND Flash via Constrained Coding", Flash Memory Summit, Santa Clara, USA, Aug. 19, 2010.
Bez et al., "Introduction to Flash memory", Proceedings of the IEEE, vol. 91, No. 4, pp. 489-502, Apr. 2003.
Blahut, R.E., "Theory and Practice of Error Control Codes," Addison-Wesley, May 1984, section 3.2, pp. 47-48.
Chang, L., "Hybrid Solid State Disks: Combining Heterogeneous NAND Flash in Large SSDs", ASPDAC, Jan. 2008.
Cho et al., "Multi-Level NAND Flash Memory with Non-Uniform Threshold Voltage Distribution," IEEE International Solid-State Circuits Conference (ISSCC), San Francisco, CA, Feb. 5-7, 2001, pp. 28-29 and 424.
Compaq et al., "Universal Serial Bus Specification", revision 2.0, Apr. 27, 2000.
Databahn™, "Flash memory controller IP", Denali Software, Inc., 1994 https://www.denali.com/en/products/databahn_flash.jsp.
Datalight, Inc., "FlashFX Pro 3.1 High Performance Flash Manager for Rapid Development of Reliable Products", Nov. 16, 2006.
Duann, N., Silicon Motion Presentation "SLC & MLC Hybrid", Flash Memory Summit, Santa Clara, USA, Aug. 2008.
Eitan et al., "Can NROM, a 2-bit, Trapping Storage NVM Cell, Give a Real Challenge to Floating Gate Cells?", Proceedings of the 1999 International Conference on Solid State Devices and Materials (SSDM), pp. 522-524, Tokyo, Japan 1999.
Eitan et al., "Multilevel Flash Cells and their Trade-Offs", Proceedings of the 1996 IEEE International Electron Devices Meeting (IEDM), pp. 169-172, New York, USA 1996.
Engh et al., "A self adaptive programming method with 5 mV accuracy for multi-level storage in FLASH", pp. 115-118, Proceedings of the IEEE 2002 Custom Integrated Circuits Conference, May 12-15, 2002.
Engineering Windows 7, "Support and Q&A for Solid-State Drives", e7blog, May 5, 2009.
Goodman et al., "On-Chip ECC for Multi-Level Random Access Memories," Proceedings of the IEEE/CAM Information Theory Workshop, Ithaca, USA, Jun. 25-29, 1989.
Gotou, H., "An Experimental Confirmation of Automatic Threshold Voltage Convergence in a Flash Memory Using Alternating Word-Line Voltage Pulses", IEEE Electron Device Letters, vol. 18, No. 10, pp. 503-505, Oct. 1997.
Han et al., "An Intelligent Garbage Collection Algorithm for Flash Memory Storages", Computational Science and Its Applications—ICCSA 2006, vol. 3980/2006, pp. 1019-1027, Springer Berlin / Heidelberg, Germany, May 11, 2006.
Han et al., "CATA: A Garbage Collection Scheme for Flash Memory File Systems", Ubiquitous Intelligence and Computing, vol. 4159/2006, pp. 103-112, Springer Berlin / Heidelberg, Aug. 25, 2006.
Hong et al., "NAND Flash-based Disk Cache Using SLC/MLC Combined Flash Memory", 2010 International Workshop on Storage Network Architecture and Parallel I/Os, pp. 21-30, USA, May 3, 2010.
Horstein, "On the Design of Signals for Sequential and Nonsequential Detection Systems with Feedback," IEEE Transactions on Information Theory IT-12:4 (Oct. 1966), pp. 448-455.
How to Resolve Bad Super Block: Magic Number Wrong "in BSD", Free Online Articles Director Article Base, posted Sep. 5, 2009.
Huffman, A., "Non-Volatile Memory Host Controller Interface (NVMHCI)", Specification 1.0, Apr. 14, 2008.
Jedec Standard JESD84-C44, "Embedded MultiMediaCard (eMMC) Mechanical Standard, with Optional Reset Signal", Jedec Solid State Technology Association, USA, Jul. 2009.
Jedec, "UFS Specification", version 0.1, Nov. 11, 2009.
Jung et al., in "A 117 mm.sup.2 3.3V Only 128 Mb Multilevel NAND Flash Memory for Mass Storage Applications," IEEE Journal of Solid State Circuits, (11:31), Nov. 1996, pp. 1575-1583.
Kang et al., "A Superblock-based Flash Translation Layer for NAND Flash Memory", Proceedings of the 6th ACM & IEEE International Conference on Embedded Software, pp. 161-170, Seoul, Korea, Oct. 22-26, 2006.
Kawaguchi et al. 1995. A flash-memory based file system. In Proceedings of the USENIX 1995 Technical Conference, New Orleans, Louisiana. 155-164.
Kim et al., "Future Memory Technology including Emerging New Memories", Proceedings of the 24th International Conference on Microelectronics (MIEL), vol. 1, pp. 377-384, Nis, Serbia and Montenegro, May 16-19, 2004.
Lee et al., "Effects of Floating Gate Interference on NAND Flash Memory Cell Operation", IEEE Electron Device Letters, vol. 23, No. 5, pp. 264-266, May 2002.
Maayan et al., "A 512 Mb NROM Flash Data Storage Memory with 8 Mb/s Data Rate", Proceedings of the 2002 IEEE International Solid-State circuits Conference (ISSCC 2002), pp. 100-101, San Francisco, USA, Feb. 3-7, 2002.
Mielke et al., "Recovery Effects in the Distributed Cycling of Flash Memories", IEEE 44th Annual International Reliability Physics Symposium, pp. 29-35, San Jose, USA, Mar. 2006.
Micron Technology Inc., "Memory Management in NAND Flash Arrays", Technical Note, year 2005.
Numonyx, "M25PE16: 16-Mbit, page-erasable serial flash memory with byte-alterability, 75 MHz SPI bus, standard pinout", Apr. 2008.
ONFI, "Open NAND Flash Interface Specification," revision 1.0, Dec. 28, 2006.
Panchbhai et al., "Improving Reliability of NAND Based Flash Memory Using Hybrid SLC/MLC Device", Project Proposal for CSci 8980—Advanced Storage Systems, University of Minnesota, USA, Spring 2009.
Park et al., "Sub-Grouped Superblock Management for High-Performance Flash Storages", IEICE Electronics Express, vol. 6, No. 6, pp. 297-303, Mar. 25, 2009.
Phison Electronics Corporation, "PS8000 Controller Specification (for SD Card)", revision 1.2 Document No. S-07018, Mar. 28, 2007.
Shalvi, et al., "Signal Codes," Proceedings of the 2003 IEEE Information Theory Workshop (ITW'2003), Paris, France, Mar. 31-Apr. 4, 2003.
SD Group and SD Card Association, "SD Specifications Part 1 Physical Layer Specification", version 3.01, draft 1.00, Nov. 9, 2009.
Serial ATA International Organization, "Serial ATA Revision 3.0 Specification", Jun. 2, 2009.
Shiozaki, A., "Adaptive Type-II Hybrid Broadcast ARQ System", IEEE Transactions on Communications, vol. 44, Issue 4, pp. 420-422, Apr. 1996.
Suh et al., "A 3.3V 32Mb NAND Flash Memory with Incremental Step Pulse Programming Scheme", IEEE Journal of Solid-State Circuits, vol. 30, No. 11, pp. 1149-1156, Nov. 1995.
ST Microelectronics, "Bad Block Management in NAND Flash Memories", Application note AN-1819, Geneva, Switzerland, May 2004.
ST Microelectronics, "Wear Leveling in Single Level Cell NAND Flash Memories," Application note AN-1822 Geneva, Switzerland, Feb. 2007.
Super User Forums, "SD Card Failure, can't read superblock", posted Aug. 8, 2010.
Takeuchi et al., "A Double Level $V_{TH}$ Select Gate Array Architecture for Multi-Level NAND Flash Memories", Digest of Technical Papers, 1995 Symposium on VLSI Circuits, pp. 69-70, Jun. 8-10, 1995.
Takeuchi et al., "A Multipage Cell Architecture for High-Speed Programming Multilevel NAND Flash Memories", IEEE Journal of Solid State Circuits, vol. 33, No. 8, Aug. 1998.
Ubuntu Forums, "Memory Stick Failed IO Superblock", posted Nov. 11, 2009.
Wu et al., "eNVy: A non-Volatile, Main Memory Storage System", Proceedings of the 6th International Conference on Architectural support for programming languages and operating systems, pp. 86-87, San Jose, USA, 1994.
International Application PCT/IL2007/000575 Search Report dated May 30, 2008.
International Application PCT/IL2007/000576 Search Report dated Jul. 7, 2008.
International Application PCT/IL2007/000579 Search report dated Jul. 3, 2008.

(56) References Cited

OTHER PUBLICATIONS

International Application PCT/IL2007/000580 Search Report dated Sep. 11, 2008.
International Application PCT/IL2007/000581 Search Report dated Aug. 25, 2008.
International Application PCT/IL2007/001059 Search report dated Aug. 7, 2008.
International Application PCT/IL2007/001315 search report dated Aug. 7, 2008.
International Application PCT/IL2007/001316 Search report dated Jul. 22, 2008.
International Application PCT/IL2007/001488 Search report dated Jun. 20, 2008.
International Application PCT/IL2008/000329 Search report dated Nov. 25, 2008.
International Application PCT/IL2008/000519 Search report dated Nov. 20, 2008.
International Application PCT/IL2008/001188 Search Report dated Jan. 28, 2009.
International Application PCT/IL2008/001356 Search Report dated Feb. 3, 2009.
International Application PCT/IL2008/001446 Search report dated Feb. 20, 2009.
U.S. Appl. No. 11/949,135 Official Action dated Oct. 2, 2009.
U.S. Appl. No. 12/019,011 Official Action dated Nov. 20, 2009.
U.S. Appl. No. 11/957,970 Official Action dated May 20, 2010.
U.S. Appl. No. 12/171,797 Official Action dated Aug. 25, 2010.
U.S. Appl. No. 11/945,575 Official Action dated Aug. 24, 2010.
U.S. Appl. No. 12/497,707 Official Action dated Sep. 15, 2010.
U.S. Appl. No. 11/995,801 Official Action dated Oct. 15, 2010.
U.S. Appl. No. 12/045,520 Official Action dated Nov. 16, 2010.
U.S. Appl. No. 12/388,528 Official Action dated Nov. 29, 2010.
U.S. Appl. No. 11/995,814 Official Action dated Dec. 17, 2010.
U.S. Appl. No. 12/251,471 Official Action dated Jan. 3, 2011.
U.S. Appl. No. 12/534,898 Official Action dated Mar. 23, 2011.
Chinese Application No. 200780026181.3 Official Action dated Apr. 8, 2011.
U.S. Appl. No. 12/178,318 Official Action dated May 31, 2011.
U.S. Appl. No. 11/995,813 Official Action dated Jun. 16, 2011.
U.S. Appl. No. 12/344,233 Official Action dated Jun. 24, 2011.
U.S. Appl. No. 12/251,471, filed Oct. 15, 2008.
U.S. Appl. No. 12/534,893, filed Aug. 4, 2009.
U.S. Appl. No. 12/534,898, filed Aug 4, 2009.
U.S. Appl. No. 12/551,583, filed Sep. 1, 2009.
U.S. Appl. No. 12/551,567, filed Sep. 1, 2009.
U.S. Appl. No. 12/558,528, filed Sep. 13, 2009.
U.S. Appl. No. 12/579,430, filed Oct. 15, 2009.
U.S. Appl. No. 12/579,432, filed Oct. 15, 2009.
U.S. Appl. No. 12/607,078, filed Oct. 28, 2009.
U.S. Appl. No. 12/607,085, filed Oct. 28, 2009.
U.S. Appl. No. 12/649,358, filed Dec. 30, 2009.
U.S. Appl. No. 12/649,360, filed Dec. 30, 2009.
U.S. Appl. No. 12/688,883, filed Jan. 17, 2010.
U.S. Appl. No. 12/728,296, filed Mar. 22, 2010.
U.S. Appl. No. 12/758,003, filed Apr. 11, 2010.
U.S. Appl. No. 12/880,101, filed Sep. 12, 2010.
U.S. Appl. No. 12/890,724, filed Sep. 27, 2010.
U.S. Appl. No. 12/822,207, filed Jun. 24, 2010.
U.S. Appl. No. 12/987,174, filed Jan. 10, 2011.
U.S. Appl. No. 12/987,175, filed Jan. 10, 2011.
U.S. Appl. No. 12/963,649, filed Dec. 9, 2010.
U.S. Appl. No. 13/021,754, filed Feb. 6, 2011.
U.S. Appl. No. 13/047,822, filed Mar. 15, 2011.
U.S. Appl. No. 13/069,406, filed Mar. 23, 2011.
U.S. Appl. No. 13/088,361, filed Apr. 17, 2011.
U.S. Appl. No. 13/114,049, filed May 24, 2011.
U.S. Appl. No. 13/170,202, filed Jun. 28, 2011.
U.S. Appl. No. 13/171,467, filed Jun. 29, 2011.
U.S. Appl. No. 12/323,544 Official Action dated Mar. 9, 2012.
Chinese Patent Application # 200780026181.3 Official Action dated Mar. 7, 2012.
Chinese Patent Application # 200780026094.8 Official Action dated Feb. 2, 2012.
U.S. Appl. No. 12/332,370 Official Action dated Mar. 8, 2012.
U.S. Appl. No. 12/579,432 Official Action dated Feb. 29, 2012.
U.S. Appl. No. 12/522,175 Official Action dated Mar. 27, 2012.
U.S. Appl. No. 12/607,085 Official Action dated Mar. 28, 2012.
Budilovsky et al., "Prototyping a High-Performance Low-Cost Solid-State Disk", SYSTOR—The 4th Annual International Systems and Storage Conference, Haifa, Israel, May 30-Jun. 1, 2011.
NVM Express Protocol, "NVM Express", Revision 1.0b, Jul. 12, 2011.
SCSI Protocol, "Information Technology—SCSI Architecture Model—5 (SAM-5)", INCITS document T10/2104-D, revision 01, Jan. 28, 2009.
SAS Protocol, "Information Technology—Serial Attached SCSI-2 (SAS-2)", INCITS document T10/1760-D, revision 15a, Feb. 22, 2009.
Wei, L., "Trellis-Coded Modulation With Multidimensional Constellations", IEEE Transactions on Information Theory, vol. IT-33, No. 4, pp. 483-501, Jul. 1987.
U.S. Appl. No. 13/114,049 Official Action dated Sep. 12, 2011.
U.S. Appl. No. 12/405,275 Official Action dated Jul. 29, 2011.
Conway et al., "Sphere Packings, Lattices and Groups", 3rd edition, chapter 4, pp. 94-135, Springer, New York, USA 1998.
Chinese Patent Application # 200780040493.X Official Action dated Jun. 15, 2011.
U.S. Appl. No. 12/037,487 Official Action dated Oct. 3, 2011.
U.S. Appl. No. 12/649,360 Official Action dated Aug. 9, 2011.
U.S. Appl. No. 13/192,504, filed Jul. 28, 2011.
U.S. Appl. No. 13/192,852, filed Aug. 2, 2011.
U.S. Appl. No. 13/231,963, filed Sep. 14, 2011.
U.S. Appl. No. 13/239,408, filed Sep. 22, 2011.
U.S. Appl. No. 13/239,411, filed Sep. 22, 2011.
U.S. Appl. No. 13/214,257, filed Aug. 22, 2011.
U.S. Appl. No. 13/192,501, filed Jul. 28, 2011.
U.S. Appl. No. 13/192,495, filed Jul. 28, 2011.
U.S. Appl. No. 12/323,544 Office Action dated Dec. 13, 2011.
U.S. Appl. No. 12/332,368 Office Action dated Nov. 10, 2011.
U.S. Appl. No. 12/063,544 Office Action dated Dec. 14, 2011.
U.S. Appl. No. 12/186,867 Office Action dated Jan. 17, 2012.
U.S. Appl. No. 12/119,069 Office Action dated Nov. 14, 2011.
U.S. Appl. No. 12/037,487 Office Action dated Jan. 3, 2012.
U.S. Appl. No. 11/995,812 Office Action dated Oct. 28, 2011.
U.S. Appl. No. 12/551,567 Office Action dated Oct. 27, 2011.
U.S. Appl. No. 12/618,732 Office Action dated Nov. 4, 2011.
U.S. Appl. No. 12/649,382 Office Action dated Jan. 6, 2012.
U.S. Appl. No. 13/284,909, filed Oct. 30, 2011.
U.S. Appl. No. 13/284,913, filed Oct. 30, 2011.
U.S. Appl. No. 13/338,335, filed Dec. 28, 2011.
U.S. Appl. No. 13/355,536, filed Jan. 22, 2012.
Kim et al., "Multi-bit Error Tolerant Caches Using Two-Dimensional Error Coding", Proceedings of the 40th Annual ACM/IEEE International Symposium on Microarchitecture (MICRO-40), Chicago, USA, Dec. 1-5, 2007.
US 7,161,836, 01/2007, Wan et al. (withdrawn)

* cited by examiner

INTERFERENCE-AWARE ASSIGNMENT OF PROGRAMMING LEVELS IN ANALOG MEMORY CELLS

CROSS-REFERENCE TO RELATED APPLICATIONS

This application claims the benefit of U.S. Provisional Patent Application 61/363,248, filed Jul. 11, 2010, U.S. Provisional Patent Application 61/372,921, filed Aug. 12, 2010, U.S. Provisional Patent Application 61/417,218, filed Nov. 25, 2010, and U.S. Provisional Patent Application 61/417,315, filed Nov. 26, 2010, whose disclosures are incorporated herein by reference.

FIELD OF THE INVENTION

The present invention relates generally to memory devices, and particularly to methods and systems for data storage in analog memory cells.

BACKGROUND OF THE INVENTION

In arrays of analog memory cells, such as in Flash memory devices, memory cells may suffer from interference from other memory cells in the array. This interference may introduce read errors and therefore degrade the storage reliability of the memory. Various techniques for interference estimation and cancellation in analog memory cell arrays are known in the art.

For example, PCT International Publication WO 2007/132457, whose disclosure is incorporated herein by reference, describes a method for operating a memory device. The method includes encoding data using an Error Correction Code (ECC) and storing the encoded data as first analog values in respective analog memory cells of the memory device. After storing the encoded data, second analog values are read from the respective memory cells of the memory device in which the encoded data were stored. At least some of the second analog values differ from the respective first analog values. A distortion that is present in the second analog values is estimated. Error correction metrics are computed with respect to the second analog values responsively to the estimated distortion. The second analog values are processed using the error correction metrics in an ECC decoding process, so as to reconstruct the data. Other example interference cancellation methods are described in PCT International Publication WO 2007/132453, whose disclosure is incorporated herein by reference.

In some known techniques, compensation for interference is carried out during programming of the memory cells. For example, U.S. Pat. No. 7,885,119, whose disclosure is incorporated herein by reference, describes techniques that compensate for electric field coupling in a programming process that takes into account the programmed state of an adjacent memory cell. To determine whether compensation is needed, the process may include sensing information about the programmed state of the adjacent memory cell, for example on an adjacent bit line or other location.

As another example, PCT International Publication WO 2009/038961, whose disclosure is incorporated herein by reference, describes a programming process for a given memory cell, which verifies the amount of programming after each programming pulse. The standard verify level for the programming cell is dependent on the target state. The verify level is further offset lower dependent on the amount of perturbation from neighboring cells, determinable by their target states.

SUMMARY OF THE INVENTION

A method for data storage includes accepting data for storage in a memory including multiple analog memory cells. For each memory cell, a respective set of nominal analog values is assigned for representing data values to be stored in the memory cell, by choosing the nominal analog values for a given memory cell in a respective range that depends on interference between the given memory cell and at least one other memory cell in the memory. The data is stored in each memory cell using the respective selected set of the nominal analog values.

In some embodiments, assigning the nominal analog values includes choosing the nominal analog values for the given memory cell in a first range when the given memory cell is subjected to the interference from the at least one other memory cell, and choosing the nominal analog values for the given memory cell in a second range, lower than the first range, when the given memory cell is not subjected to the interference from the at least one other memory cell.

In some embodiments, assigning the nominal analog values includes choosing the nominal analog values for the given memory cell in a first range when the given memory cell is expected to cause the interference to the at least one other memory cell, and choosing the nominal analog values for the given memory cell in a second range, higher than the first range, when the given memory cell is not expected to cause the interference to the at least one other memory cell.

In an embodiment, assigning the nominal analog values includes selecting, for each memory cell, at least one parameter selected from a group of parameters consisting of a minimum programming voltage, a maximum programming voltage, and a size of the set of the nominal analog values.

In a disclosed embodiment, assigning the nominal analog values includes, for a group of N memory cells, dividing an N-dimensional space spanned by respective analog values of the N memory cell into a first region that is not available for positioning combinations of programming levels due to the interference, and a second region that is available for positioning the combinations of programming levels, and assigning the sets of the nominal analog values to the N memory cells only within the second region. In an embodiment, the second region is non-cubical. In an embodiment, the second region is a polytope.

In another embodiment, assigning the nominal analog values includes choosing the nominal analog values in the range in which a maximum difference between the nominal analog values assigned to the given memory cell and the nominal analog values assigned to the at least one other memory cell does not exceed a predefined threshold. In yet another embodiment, assigning the nominal analog values includes assigning to the given memory cell a first number of the analog values when the interference is low, and a second number of the analog values, lower than the first number, when the interference is high.

In still another embodiment, assigning the nominal analog values includes providing a baseline set of the analog values, and assigning to each memory cell a respective subset of the baseline set, which lies in the respective range, depending on the interference. In an embodiment, storing the data includes encoding the accepted data with a code that causes the encoded data to be mapped to the nominal analog values chosen within the respective range in each memory cell. The code may include a Trellis Shaping code.

In a disclosed embodiment, assigning the nominal analog values for a group of the memory cells includes initially choosing the nominal analog values for all the memory cells in the group, and subsequently mapping a respective data value to one of the chosen nominal analog values in each of the memory cells. In an alternative embodiment, assigning the nominal analog values for a group of the memory cells includes choosing the nominal analog values for a first memory cell in the group and mapping a respective data value to one of the nominal analog values chosen for the first memory cell, and choosing the nominal analog values for a second memory cell in the group based on the data value mapped to the first memory cell. In an example embodiment, assigning the nominal analog values includes assigning at least one negative nominal analog value for representing a non-erased programming level.

In some embodiments, the method includes storing information indicative of the assigned sets of the nominal analog values. The method may include retrieving the data from the memory cells by retrieving the stored information, recreating the assigned sets from the retrieved information, and reading the data from the memory cells in accordance with the recreated sets of the nominal analog values.

In an embodiment, storing the information includes encoding the information with an Error Correction Code (ECC) to produce data bits and redundancy bits and storing only the redundancy bits, and recreating the assigned sets includes reading some of the memory cells so as to estimate assignment of the sets, applying error correction to the estimated assignment using the stored redundancy bits, and recreating the sets from the estimated assignment after the error correction.

In another embodiment, the memory cells include at least first and second memory cells, and assigning the nominal analog values includes assigning respective, different first and second sets of the analog values to the first and second memory cells. In yet another embodiment, assigning the nominal analog values includes assigning to first and second memory cells respective first and second sets of the nominal analog values having at least one nominal analog value in common. In still another embodiment, assigning the nominal analog values includes assigning to first and second memory cells respective first and second sets of the nominal analog values, such that the first set is a subset of the second set.

In some embodiments, two or more memory cells are assigned respective sets of the nominal analog values that are drawn from a superset of K possible nominal analog values, and storing the data includes shaping a sequence of data bits into respective shaped bits, and storing the shaped bits in the respective memory cells using the assigned sets.

There is additionally provided, in accordance with an embodiment of the present invention, a data storage apparatus including an interface and programming circuitry. The interface is configured for communicating with a memory including multiple analog memory cells. The programming circuitry is configured to accept data for storage in the memory, to assign, for each memory cell, a respective set of nominal analog values for representing data values to be stored in the memory cell, by choosing the nominal analog values for a given memory cell in a respective range that depends on interference between the given memory cell and at least one other memory cell in the memory, and to store the data in each memory cell using the respective selected set of the nominal analog values.

There is also provided, in accordance with an embodiment of the present invention, a data storage apparatus including a memory and programming circuitry. The memory includes multiple analog memory cells. The programming circuitry is configured to accept data for storage in the memory, to assign, for each memory cell, a respective set of nominal analog values for representing data values to be stored in the memory cell, by choosing the nominal analog values for a given memory cell in a respective range that depends on interference between the given memory cell and at least one other memory cell in the memory, and to store the data in each memory cell using the respective selected set of the nominal analog values.

The present invention will be more fully understood from the following detailed description of the embodiments thereof, taken together with the drawings in which:

DETAILED DESCRIPTION OF EMBODIMENTS

Overview

Figure 1:
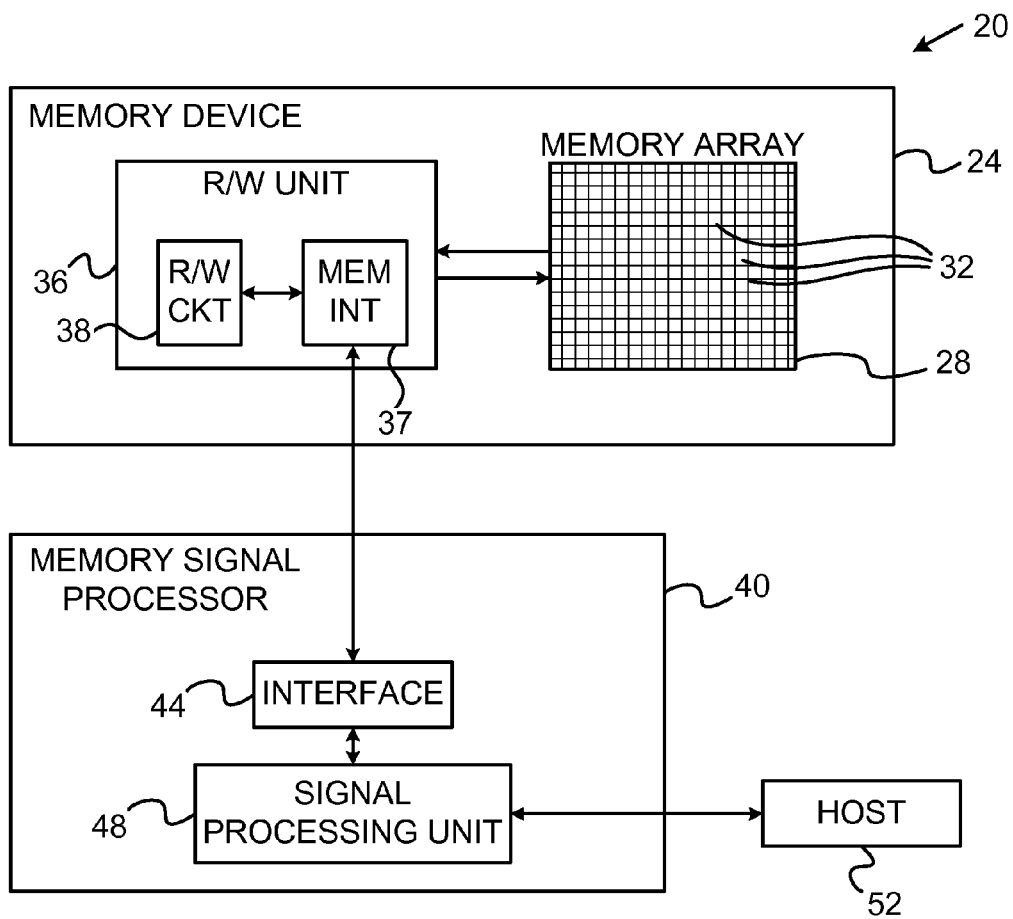
FIG. 1 is a block diagram that schematically illustrates a memory system, in accordance with an embodiment of the present invention.

In practical memory devices, memory cells may cause interference to one another, for example because of electric field cross-coupling between the memory cells. This interference may cause read errors and degrade the storage reliability of the memory. Embodiments of the present invention that are described herein provide improved methods and systems for reducing interference in arrays of analog memory cells.

In some embodiments, a memory system comprises programming circuitry that stores data in an array of analog memory cells. Data is stored in each memory cell by writing into the memory cell a nominal analog value, which is selected from a set of nominal storage values that represent respective data values. The nominal analog values that represent the different data values are also referred to as programming levels, and the two terms are used interchangeably hereinbelow.

In the disclosed embodiments, the programming circuitry assigns a respective set of programming levels individually for each memory cell. The set of programming levels for a given memory cell is assigned depending on the (current or expected) interference between this memory cell and at least one other memory cell in the array.

For example, a memory cell that suffers from severe interference from neighboring memory cells may be assigned programming levels having high analog values. As will be explained below, the analog values of memory cells that are in an erased level suffer from particularly severe distortion due to interference. This distortion often makes it difficult to distinguish between the erased level and other programming levels. Assigning programming levels having high analog values to severely-interfered memory cells solves this problem. By contrast, a memory cell that does not experience severe interference may be assigned programming levels having low analog values.

As another example, a memory cell that is expected to cause severe interference to a neighboring memory cell (e.g., because the memory cell is to be programmed to a high analog value) may be assigned programming levels having low analog values in order to reduce the interference.

In some disclosed techniques, the assignment process considers a group of N memory cells that potentially cause interference to one another. The combinations of analog values of these N memory cells can be viewed as an N-dimensional space. This space can be divided into a region that is not attainable for positioning programming levels due to the interference, and a region that is attainable. The programming circuitry distinguishes between these two regions, and assigns the programming levels for the N memory cells only within the attainable region.

In other disclosed embodiments, the programming circuitry holds a predefined full set of programming levels, and assigns each memory cell a respective subset of these programming levels depending on interference conditions.

Several example assignment schemes are described herein. In some of the assignment schemes, the storage density (e.g., the number of bits per cell) is varied depending on the level of interference. In some embodiments, the programming circuitry stores information indicative of the programming levels that were assigned to the various memory cells, in order to enable data readout from each memory cell using the appropriate programmed levels.

The disclosed techniques thus assign each memory cell a respective set of programming levels that is tailored to the specific interference conditions of that memory cell. Therefore, these techniques are highly effective in reducing interference while optimizing storage reliability and capacity.

System Description

FIG. 1 is a block diagram that schematically illustrates a memory system 20, in accordance with an embodiment of the present invention. System 20 can be used in various host systems and devices, such as in computing devices, cellular phones or other communication terminals, removable memory modules ("USB drive" devices), Solid State Disks (SSD), digital cameras, music and other media players and/or any other system or device in which data is stored and retrieved.

System 20 comprises a memory device 24, which stores data in a memory cell array 28. The memory array comprises multiple analog memory cells 32. In the context of the present patent application and in the claims, the term "analog memory cell" is used to describe any memory cell that holds a continuous, analog value of a physical parameter, such as an electrical voltage or charge. Array 28 may comprise analog memory cells of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells.

The charge levels stored in the cells and/or the analog voltages or currents written into and read out of the cells are referred to herein collectively as analog values, analog storage values or storage values. Although the embodiments described herein mainly address threshold voltages, the methods and systems described herein may be used with any other suitable kind of analog values.

System 20 stores data in the analog memory cells by programming the cells to assume respective programming states, which are also referred to as programming levels. The programming states are selected from a finite set of possible states, and each programming state corresponds to a certain nominal storage value. For example, a 3 bit/cell MLC can be programmed to assume one of eight possible programming states by writing one of eight possible nominal storage values into the cell.

Memory device 24 comprises a reading/writing (R/W) unit 36, which converts data for storage in the memory device to analog storage values and writes them into memory cells 32. In alternative embodiments, the R/W unit does not perform the conversion, but is provided with voltage samples, i.e., with the storage values for storage in the cells. When reading data out of array 28, R/W unit 36 converts the storage values of memory cells 32 into digital samples having a resolution of one or more bits.

Data is typically written to and read from the memory cells in groups that are referred to as pages. In some embodiments, the R/W unit can erase a group of cells 32 by applying one or more negative erasure pulses to the cells. In the embodiment of FIG. 1, R/W unit 36 comprises a memory interface 37 for communicating with memory cells 28, and R/W circuitry 38 that carries out the programming and readout functions of the R/W unit.

The storage and retrieval of data in and out of memory device 24 is performed by a Memory Signal Processor (MSP) 40. MSP 40 comprises an interface 44 for communicating with memory device 24, and a signal processing unit 48 that processes the data that is written into and read from device 24. In some embodiments, unit 48 produces the storage values for storing in the memory cells and provides these values to R/W unit 36. Alternatively, unit 48 provides the data for storage, and the conversion to storage values is carried out by the R/W unit internally to the memory device. Alternatively to using an MSP, the methods described herein can be carried out by any suitable type of memory controller.

MSP 40 communicates with a host 52, for accepting data for storage in the memory device and for outputting data retrieved from the memory device. MSP 40, and in particular unit 48, may be implemented in hardware. Alternatively, MSP 40 may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

In the exemplary system configuration shown in FIG. 1, memory device 24 and MSP 40 are implemented as two separate Integrated Circuits (ICs). In alternative embodiments, however, the memory device and the MSP may be integrated on separate semiconductor dies in a single Multi-Chip Package (MCP) or System on Chip (SoC), and may be interconnected by an internal bus. Further alternatively, some or all of the MSP circuitry may reside on the same die on which the memory array is disposed. Further alternatively, some or all of the functionality of MSP 40 can be implemented in software and carried out by a processor or other element of the host system. In some embodiments, host 44 and MSP 40 may be fabricated on the same die, or on separate dies in the same device package.

In some embodiments, MSP 40 (or other memory controller that carries out the methods described herein) comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In an example configuration of array 28, memory cells 32 are arranged in multiple rows and columns, and each memory cell comprises a floating-gate transistor. The gates of the transistors in each row are connected by word lines, and the sources of the transistors in each column are connected by bit lines. The memory array is typically divided into multiple pages, i.e., groups of memory cells that are programmed and read simultaneously. Pages are sometimes sub-divided into sectors. In some embodiments, each page comprises an entire row of the array. In alternative embodiments, each row (word line) can be divided into two or more pages. For example, in some devices each row is divided into two pages, one comprising the odd-order cells and the other comprising the even-order cells. In a typical implementation, a two-bit-per-cell memory device may have four pages per row, a three-bit-per-cell memory device may have six pages per row, and a four-bit-per-cell memory device may have eight pages per row.

Erasing of cells is usually carried out in blocks that contain multiple pages. Such blocks are referred to herein as erasure blocks or memory blocks. Typical memory devices may comprise several thousand erasure blocks. In a typical two-bit-per-cell MLC device, each erasure block is on the order of 32 word lines, each comprising several tens of thousands of cells. Each word line of such a device is often partitioned into four pages (odd/even order cells, least/most significant bit of the cells). Three-bit-per cell devices having 32 word lines per erasure block would have 192 pages per erasure block, and four-bit-per-cell devices would have 256 pages per block. Alternatively, other block sizes and configurations can also be used. Some memory devices comprise two or more separate memory cell arrays, often referred to as planes. Since each plane has a certain "busy" period between successive write operations, data can be written alternately to the different planes in order to increase programming speed.

In some embodiments, R/W unit 36 programs memory cells 32 using an iterative Program and Verify (P&V) process. In a typical P&V process, an entire group of memory cells (e.g., a word line) is programmed by applying a sequence of programming pulses to the memory cells in the group. The storage values programmed in the cells are read after each pulse and compared ("verified") with one or more verification thresholds. The programming iterations continue selectively only for memory cells that have not yet reached the desired levels.

Effect of Cross-Coupling Interference on Erased Level Distribution

In a typical implementation, memory cells are erased by setting them to a certain range of threshold voltages referred to as an "erased level." Typically although not necessarily, the erased level occupies a range of negative threshold voltages, while the other programming levels occupy respective ranges of positive threshold voltages. (The erased level is regarded herein as one of the programming levels, since when the memory cells are programmed, one of the possible data values typically corresponds to this level.)

When erased memory cells are subject to cross-coupling interference from neighboring memory cells, the interference may cause the threshold voltages of the erased cells to increase, possibly to large positive values. This effect decreases the threshold voltage range that is available for the other programming levels (sometimes referred to as "voltage window"), and may therefore degrade the reliability and storage capacity of the memory.

Consider, for example, a Flash memory in which the erase level is defined as the range $-5V \leq Vt \leq 3.5V$, and the threshold voltages of programmed cells can reach up to 5V. Assume that each erased cell is affected by four neighboring cells with a cross-coupling ratio of 20%. The shift caused to the threshold voltages of the erased cells can reach up to $0.2 \times 4 \times (5-(-5))=8V$. This shift causes severe widening of the threshold voltage distribution of the erased cells, which can reach threshold voltages of up to $-3.5+8=4.5V$. The following figures demonstrate the severity of this effect.

Figure 2A:
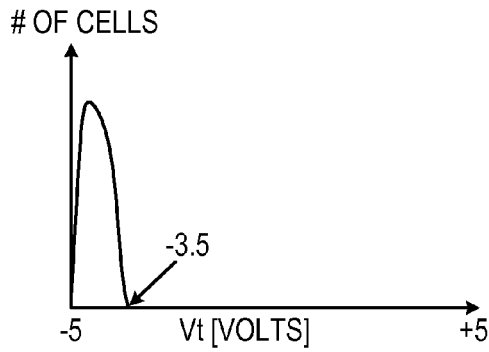
FIGS. 2A-2D are graphs showing threshold voltage distributions of an erased level in various interference scenarios, in accordance with embodiments of the present invention.
Figure 2B:
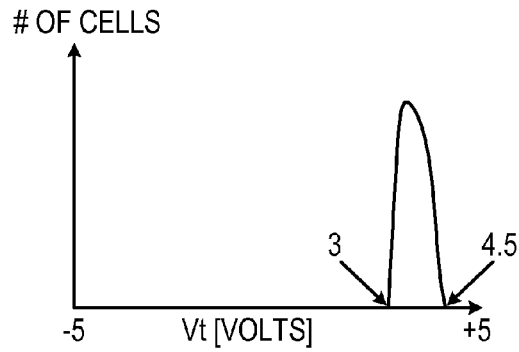

FIGS. 2A-2D are graphs showing threshold voltage distributions of an erased level in various interference scenarios, in accordance with embodiments of the present invention. FIG. 2A shows the distribution of threshold voltages in the absence of cross-coupling interference. In this case, the erased level distribution lies between $-5V$ and $-3.5V$. FIG. 2B shows the threshold voltage distribution of the erased level under worst-case interference, i.e., when all four neighbor cells are programmed from $Vt=-5V$ to $Vt=5V$. In this case, the erased level distribution lies between 3V and 4.5V.

Figure 2C:
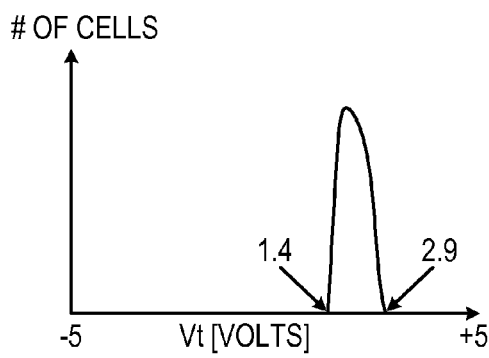
Figure 2D:
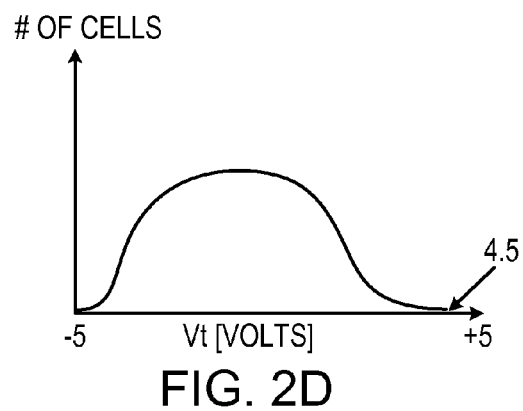

FIG. 2C shows an intermediate case, in which the four neighbor cells are programmed from $Vt=-4V$ to $Vt=4V$. In this case, the erased level distribution lies between 1.4V and 2.9V. FIG. 2D shows the threshold voltage distribution of the erased level, when averaged over the various possible neighbor cell values. As can be seen in the figure, the center of the threshold voltage distribution is shifted from approximately $-4V$ to approximately 0V. The erased level distribution is also considerably widened, reaching up to 4.5V.

As can be appreciated from these figures, the shift in threshold voltages of erased cells due to cross-coupling interference may span a large part of the available voltage window. This effect may cause considerable degradation in storage capacity, endurance and reliability. In the extreme example of FIGS. 2A-2D, only 0.5V out of the 5V voltage window remains for programming the memory cells.

In milder cases (e.g., when the coupling ratios are lower or when the threshold voltages of the erased cells are far below zero) the threshold voltages of erased cells may remain below zero following the interference-related shift. Nevertheless, the shift and widening of the erased level may degrade storage performance. For example, in some embodiments one or more of the programming levels other than the erased level occupies a range of negative threshold voltages. Techniques of this sort are described, for example, in U.S. Pat. No. 7,751,240, whose disclosure is incorporated herein by reference. When using such schemes, any shift or widening of the erased level may decrease the voltage range that is available for programming.

In order to reduce interference, in some embodiments the memory cells are programmed in a gradual, interleaved manner. In these embodiments, neighboring cells are partially programmed before the potentially-interfered cells are programmed to their final values. Programming orders for reducing interference are addressed, for example, by Takeuchi et al., in "A Multipage Cell Architecture for High-Speed Programming Multilevel NAND Flash Memories," IEEE Journal of Solid-State Circuits, volume 33, issue 8, August, 1998, pages 1228-1238, which is incorporated herein by reference, and in PCT International Publication WO 2009/037691, whose disclosure is incorporated herein by reference. This sort of programming is effective in reducing interference to the programming levels other than the erased level. Interference to the erased level and the resulting voltage window degradation, however, are generally unaffected by this technique.

In some embodiments of the present invention, system 20 assigns a set of programming levels for each memory cell 32 depending on the expected interference between the memory cell and at least one neighbor cell. In some embodiments, the programming levels are defined jointly for groups of mutually-interfering memory cells. Example techniques of this sort are shown in FIGS. 3 and 4A-4E below. In other embodiments, the set of programming levels is selected individually for each memory cell depending on the expected interference to and/or from neighboring cells. Example techniques of this sort are shown in FIGS. 5A-5C and 6 further below.

Interference Mitigation by Assignment of Programming Levels in Attainable Threshold Voltage Regions In some embodiments, system 20 assigns the programming levels jointly for a group of N memory cells, depending on the mutual interference among the memory cells in the group. In some embodiments, system 20 divides the N-dimensional space of threshold voltages of the N memory cells into an attainable region and a non-attainable region, and assigns the programming levels in the attainable region. The term "attainable region" means a region of threshold voltage combinations that are available for positioning programming levels, even in the presence of inter-cell interference. The term "non-attainable region" means a region of threshold voltage combinations that is not available for positioning programming levels due to the interference.

Consider, for example, two neighboring memory cells 32 that potentially cause cross-coupling interference to one another. In the present example, an erased cell has a threshold voltage of −3V before its neighbor cell is programmed, and the maximum possible programmable threshold voltage is 4V. The coupling ratio between the two memory cells is assumed to be 20%. We shall assume that the two cells interfere with each other, but they are not interfered by any other memory cell. Assume also that the memory cells are programmed in an interleaved manner, as explained above, such that interference to programmed levels is compensated for.

In this example, when the threshold voltage of one cell is X volts, the interference caused to the other cell is 0.2·(X−(−3))=0.6+X/5 volts. When the interfered cell is in the erased level, its threshold voltage is increased from Vt=−3V to Vt=−2.4+X/5V. (Put in another way, the interference can be written as 0.2·(X'+3) wherein X' denotes the interference-free read threshold of the interfering cell. When all the neighbors of the interfering cell are erased, X'=X, and the latter equation becomes equivalent to the former.)

Figure 3:
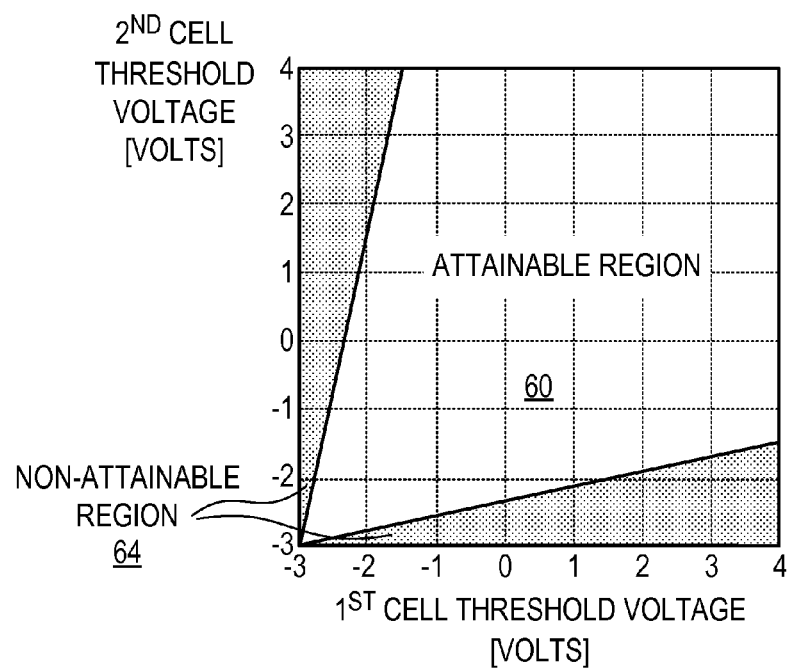
FIG. 3 is a diagram showing attainable and non-attainable threshold voltage regions, in accordance with an embodiment of the present invention.

FIG. 3 is a diagram showing attainable and non-attainable threshold voltage regions, in accordance with an embodiment of the present invention. The figure shows a two-dimensional space of threshold voltages of the two memory cells. The horizontal axis corresponds to the threshold voltage of the first memory cell, and the vertical axis corresponds to the threshold voltage of the second memory cell.

An attainable region 60 defines the threshold voltage combinations (pairs of {Vt of the first memory cell, Vt of the second memory cell}) that are attainable in spite of the interference between the memory cells. A non-attainable region 64 defines the threshold voltage combinations that are not attainable because of the interference between the memory cells. As can be seen in the figure, the attainable region contains threshold voltage pairs in which one memory cell has a low threshold voltage and the other memory cell has a high threshold voltage. In such a situation, the latter memory cell is likely to cause interference to the former memory cell that prevents it from being at a low threshold voltage. Such pairs of threshold voltages are therefore not available for positioning of programming levels, and should be avoided.

In some embodiments, system 20 assigns the programming levels for the two memory cells within the attainable region, and does not assign programming levels in the non-attainable region. As a result, the cross-coupling interference to the erased cells and to cells that are at low threshold voltage is avoided.

In some embodiments, the attainable region can be defined in terms of the difference between the analog values assigned to the first memory cell and the analog values assigned to the second memory cell, possibly after scaling each analog value by a certain constant. In these embodiments, system 20 assigns the programming levels such that the maximum difference between the analog values assigned to the first memory cell and the analog values assigned to the second memory cell does not exceed a predefined threshold.

The shapes of the attainable and non-attainable regions typically depend on the minimum and maximum possible threshold voltages, and on the coupling ratio between the memory cells. In the present example, the size of the attainable region is approximately 80% of the overall [−3,4)×[−3,4) space. In real-life memory devices having a coupling ratio of 20%, the actual size of the attainable region may be smaller, because interference is caused by more than one neighboring cell (e.g., two dominant interfering cells that are positioned vertically relative to the interfered cell in the cell array, two horizontally-positioned interfering cells and four weaker diagonally-positioned interfering cells).

FIGS. 4A-4E are diagrams showing programming level constellations that are positioned in the attainable region, in accordance with embodiments of the present invention. Similarly to FIG. 3 above, diagonal lines mark the boundaries between the attainable and non-attainable regions. In all of these examples, system 20 assigns the programming levels for the two memory cells within attainable region 60.

The examples of FIGS. 4A-4E show programming level constellations for a pair of eight-level, 3 bits/cell memory cells. Threshold voltages 68 and 72, marked as points in the two-dimensional Vt space, represent the centers of the threshold voltage distributions. In other words, points 68 and 72 denote nominal analog values that represent the various data value combinations to be stored in the memory cells. Points 68 denote threshold voltage pairs for which at least one of the memory cells is in the erased level. Points 72 denote threshold voltage pairs for which both memory cells are in non-erased programming levels. The widths of the threshold voltage distributions are not shown in the figures for the sake of clarity.

Figure 4A:
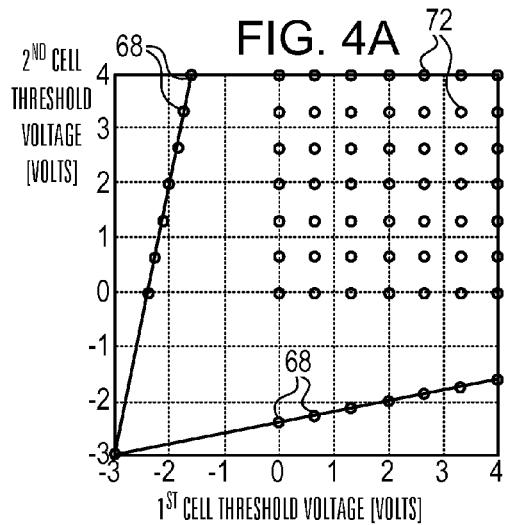
FIGS. 4A-4E are diagrams showing programming level constellations that are positioned in an attainable region, in accordance with embodiments of the present invention.

In the constellation of FIG. 4A, the erased levels of both memory cells are represented by negative threshold voltages, while the non-erased programming levels are represented by positive (or at least non-negative) threshold voltages. The threshold voltages representing the non-erased levels lie on a regular Cartesian grid. Each memory cell may be in the erased level, or in one of seven non-erased programming levels whose nominal analog values are defined as $PVi=(i-1)\times\frac{2}{3}$ Volts, $i=1\ldots 7$. The nominal analog values of the two memory cells are distributed uniformly in the square $[0,4)\times[0,4)$. The constellation of FIG. 4A can be generalized in a straightforward manner to N>2 memory cells, by setting the nominal analog values of the non-erased programming levels on a regular grid in the N-dimensional hyper-cube $[0,Vmax)^N$.

When using the programming level constellation of FIG. 4A, data can be read from the memory cells using non-negative read thresholds that may be positioned separately for each memory cell. This constellation is suitable, for example, in memory devices that are not able to apply negative read thresholds and negative programming thresholds.

Figure 4B:
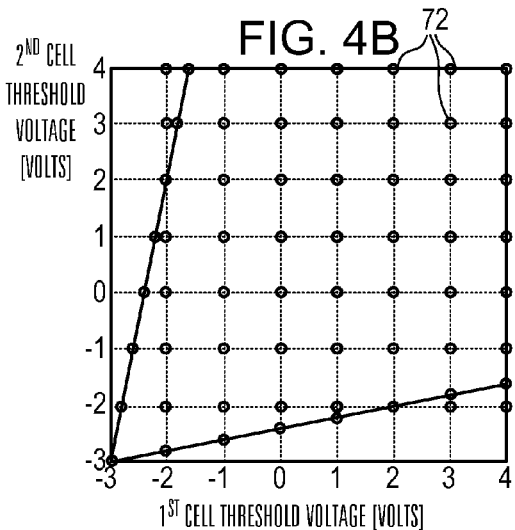

The constellation of FIG. 4B, on the other hand, can be used in memory devices that are capable of applying negative read thresholds and programming thresholds, such as the devices described in U.S. Pat. No. 7,751,240, cited above. In this example, the nominal analog values of non-erased programming levels are allowed to occupy negative threshold voltages. As a result, the programming levels are distributed with greater distances from one another, thereby improving storage reliability. In this particular example, each memory cell may be in the erased level, or in one of seven non-erased programming levels whose nominal analog values are defined as $PVi=-3+i$ Volts, $i=1\ldots 7$. In this example, however, some pairs of programming levels fall in region 64 and are therefore not attainable, and some pairs of programming levels are very close to region 64 and therefore have small distances from other pairs of programming levels. These properties may degrade storage performance.

Figure 4C:
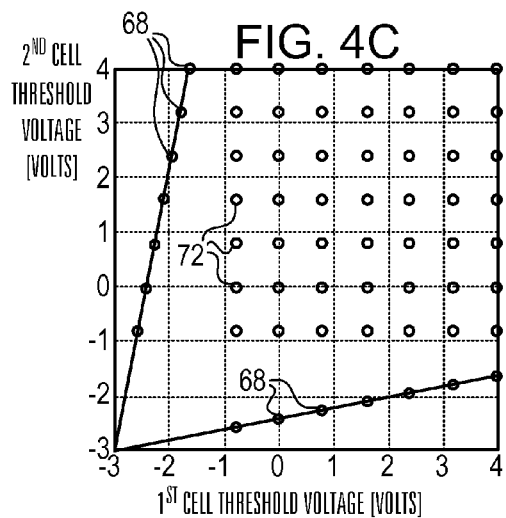

The constellation of FIG. 4C provides an alternative trade-off. In this example, each memory cell may be in the erased level, or in one of seven non-erased programming levels whose nominal analog values are distributed uniformly in the square $[-0.8,Vmax]\times[-0.8,Vmax]$. In the example of FIG. 4C one non-erased programming level of each memory cell corresponds to a negative threshold voltage, and all the programming levels lie in the attainable region. On the other hand, some of the attainable region (e.g., X→1V or Y→1V) is not occupied.

In some embodiments, the attainable region in which system 20 sets the nominal analog values of the programming levels is defined as the polytope (N-dimensional polygon):

$$R = \left\{ (x_1, \ldots, x_N) \middle| \begin{array}{l} V_E < x_i < V_{\max} \\ x_i > V_E + \sum_j a_{ij}(x_j - V_E) \\ \forall\, i = 1 \ldots N \end{array} \right\} \quad [1]$$

In Equation 1, $V_E$ denotes the lowest threshold voltage used for erased levels (the upper edge of the erased level Vt distribution, after retention and in the absence of interference), $V_{max}$ denotes the highest threshold voltages used for representing the programming levels, N denotes the number of memory cells in the group, and $a_{ij}$ denote the interference coupling coefficients between memory cells i and j. This sort of N-dimensional polygon is formed by removing the non-attainable region from the N-dimensional hyper-cube $[V_E, V_{max}]^N$. Attainable region 60 of FIG. 3 above is a two-dimensional example of such a polygon.

Figure 4D:
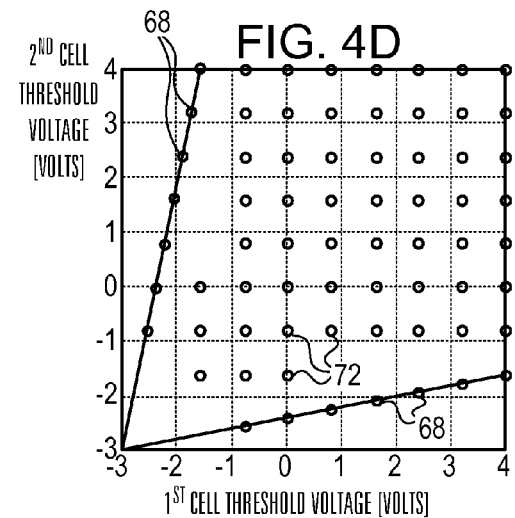

System 20 can assign the programming levels in this attainable region in various ways. For example, FIG. 4D shows a constellation in which the number of programming levels (and therefore the storage density or the number of bits per cell) varies depending on the level of interference. As can be seen by comparing FIG. 4D with FIG. 4C, the constellation of FIG. 4D has five additional points 72 (corresponding to −1.6V) in the previously-unused areas of the attainable region. The non-erased programming levels remain on the same Cartesian grid as in FIG. 4C.

In this constellation, when interference between the memory cells is low, one or both memory cells use nine programming levels instead of eight. Thus, on average, the storage capacity is improved. Since the additional programming levels are used only when interference is low, without decreasing the distances between adjacent programming levels, storage reliability is not affected.

In some embodiments, departing from a Cartesian grid enables increasing the number of programming levels without reducing the distances between adjacent levels. Non-Cartesian constellations enable better use of the attainable region. Alternatively, using a non-Cartesian grid enables increasing the distances between adjacent programming levels for a given number of programming levels.

Figure 4E:
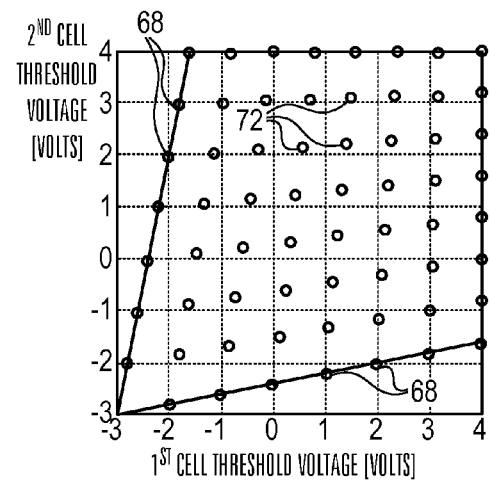

FIG. 4E shows an example of such a non-Cartesian constellation. In the present example, the distances between adjacent programming levels are improved relative to FIG. 4C because the constellation points fill the attainable range more evenly. Note that in this example the distances between constellation points are not uniform, and the distances between constellation points in which one of the cells is at its maximum programming voltage are equal to the distances between constellation points in the constellation used in FIG. 4C. FIG. 4E demonstrates that non-Cartesian constellations are superior to Cartesian constellation, but it does not necessarily show the optimal constellation in the sense of minimum distance between pairs. A more elaborated constellation design can improve the minimum distance between constellation points by taking advantage of the vacant segments of the attainable region that are not utilized by the constellation of FIG. 4C.

The programming level constellations of FIGS. 4A-4E are example constellations that are chosen purely for the sake of conceptual clarity. In alternative embodiments, any other suitable programming level constellation can be used. For example, the constellation can be defined for any suitable number of memory cells, for any suitable storage density (e.g., number of bits/cell), and/or in attainable regions having any other suitable shapes. Note that the attainable region in the above example is non-cubical.

From an Information-Theory standpoint, N threshold voltage values in N memory cells forms an N-dimensional constellation. A special case of such a constellation is an N-dimensional lattice code. The amount of information that can be reliably stored in the constellation (or lattice) depends on two factors:

- The fine structure of the constellation, e.g., the distances between its constellation points, and especially the minimum distance. Error correction codes, such as Bose-Chaudhuri-Hocquenghem (BCH) or Low-Density Parity Check (LDPC) codes, are designed to improve these distances. This improvement is known as coding gain.
- The volume that is occupied by the constellation in the N-dimensional space ($R^N$ wherein R denotes the real numbers axis). Shaping schemes such as the Laroia shaping (also referred to as "flexible shaping") or Trellis shaping schemes are designed to increase the volume of the constellation per given power constraints. Such techniques are described, for example, by Forney Jr., in "Trellis Shaping," IEEE Transactions on Information Theory, volume 38, no. 2, March, 1992, pages 281-300, which is incorporated herein by reference. The benefit of increasing the constellation volume is known as shaping gain.

Assuming Additive White Gaussian Noise (AWGN), two constellations having an equal density of constellation points in the N-dimensional space (e.g., based on the same lattice), and which use two different volumes V1 and V2 in the N-dimensional real-valued space, will theoretically have a difference of $\log_2(V1/V2)/N$ in the number of bits that they can transmit per cell. Moreover, in the AWGN case, an optimal capacity-achieving constellation that employs a shaping region of volume V1 will outperform the information density of an optimal capacity-achieving constellation that employs a shaping region of smaller volume V2 by a factor that is approximately $\log_2(V1/V2)/N$ bits/cell, wherein the approximation becomes more accurate as N increases.

Practically, this difference may vary due to the details of the structure of the constellation near the boundaries of the shaping region. For example, in the examples of FIGS. 4A-4E, N=2 and the volumes comprise two-dimensional regions. The volume of the polygonal attainable region (which is the shaping zone) in this example is 0.8·7·7=39.2. The optimal square region that does not overlap the non-attainable region is [−1.6,4]×[−1.6,4] and its area is 5.6·5.6=31.36. The ratio between the two volumes (areas) is 1.25. Thus, using the non-cubical shaping region (as in FIG. 4D) can improve the capacity by a factor of $\log_2(0.8)/2=0.16$ bits/cell. The actual improvement in the 69-point constellation of FIG. 4D, over the 64-point constellation of FIG. 4C (which have the same minimum distance and internal structure) is $\log_2(69/64)/2=0.054$ bits/cell.

Thus, the example schemes of FIGS. 4D and 4E improve the information density or noise robustness by employing non-rectangular (or more generally—non-cubical) shaping regions that are matched to the attainable region dictated by the physics of the memory array.

In some embodiments, system 20 assigns the set of programming levels for a particular memory cell by assigning the minimum and/or maximum of the nominal analog values to be written into the cell, and/or the number of programming levels to be used in programming the cell. In some embodiments, two sets of nominal analog values that are respectively assigned to two memory cells have at least one nominal analog voltage in common. In some embodiments, a set of nominal analog values assigned to a certain memory cell is a subset of the set of nominal analog values assigned to another cell.

In some embodiments, the sets of nominal analog values assigned to the various memory cells are all subsets of a "superset" of K nominal analog values. The system comprises a sequencing circuit, which accepts bits for storage and maps the bits stored in each cell to a respective nominal analog value selected from the K possible values. A shaping circuit generates bits that cause the sequencing circuit to use the appropriate subset of the K nominal analog values in each cell.

Interference Mitigation by Interference-Dependent Cell-By-Cell Selection of Programming Levels In some embodiments, system 20 chooses a different set of these programming levels (having respective nominal analog values) for storing data in each memory cell, on a cell-by-cell basis. The set of programming levels for a given memory cell 32 is chosen depending on the interference between this memory cell and at least one other memory cell in array 28.

Figure 5A:
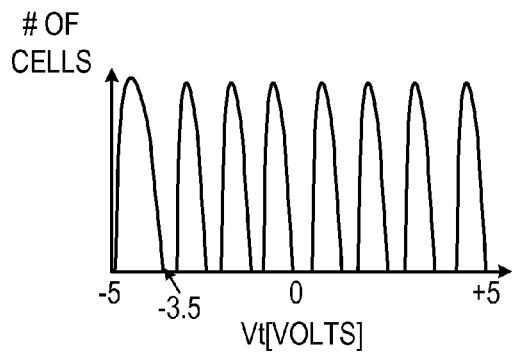
FIGS. 5A-5C are graphs showing selected programming level constellations for various interference scenarios, in accordance with an embodiment of the present invention.
Figure 5B:
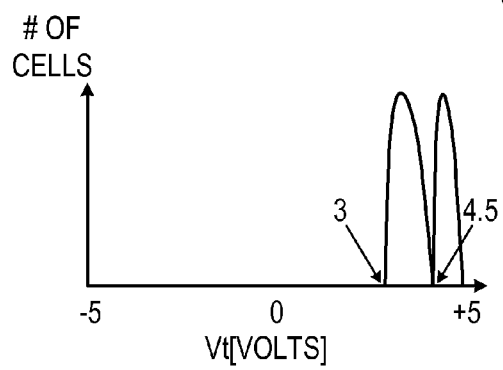
Figure 5C:
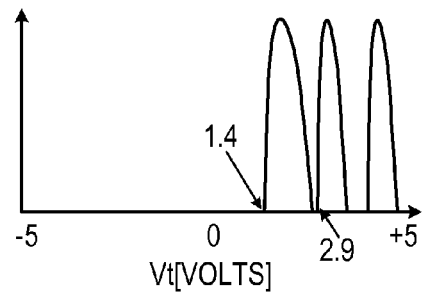

FIGS. 5A-5C are graphs showing selected programming level constellations for various interference scenarios, in accordance with an embodiment of the present invention. The constellations of FIGS. 5A-5C correspond to the interference scenarios of FIGS. 2A-2C above, respectively.

FIG. 5A shows a full set of eight programming levels (one erased level and seven non-erased programming levels) defined for the memory cells. The full set is chosen for a given memory cell when interference is low, for example when all the neighboring memory cells are erased.

FIG. 5B is chosen for a given memory cell when the interference is strong, as in the scenario of FIG. 2B above. In this scenario, the erased level is shifted to lie between 3V and 4.5V, and therefore only a single non-erased programming level is used, to give a total of two programming levels.

FIG. 5C is chosen for a given memory cell in intermediate interference scenarios such as the scenario of FIG. 2C above. In this scenario, the erased level is shifted to lie between 1.4V and 2.9V, and therefore two non-erased programming levels are assigned, to give a total of three programming levels.

In some embodiments, although not necessarily, system 20 uses a predefined baseline set of programming levels, and chooses the appropriate subset from this baseline set for each memory cell depending on the interference to/from that memory cell. For example, the system may use the eight-level set shown in FIG. 5A for low interference, and choose suitable subsets from this set for stronger interference scenarios. In such a case, the memory device programs or samples only eight analog levels. This feature is especially important when jointly programming or reading multiple memory cells.

As explained above, the selection of programming levels for a given memory cell typically depends on both the interference caused by the memory cell and the interference suffered by the memory cell. For example, if the memory cell suffers from strong interference, the system would typically select programming levels that correspond to high threshold voltages. If the memory cell is expected to cause strong interference to a neighboring cell (which is erased or programmed to a programming level having small threshold voltage), the system would typically select programming levels corresponding to small threshold voltages in order to reduce this interference.

Figure 6:
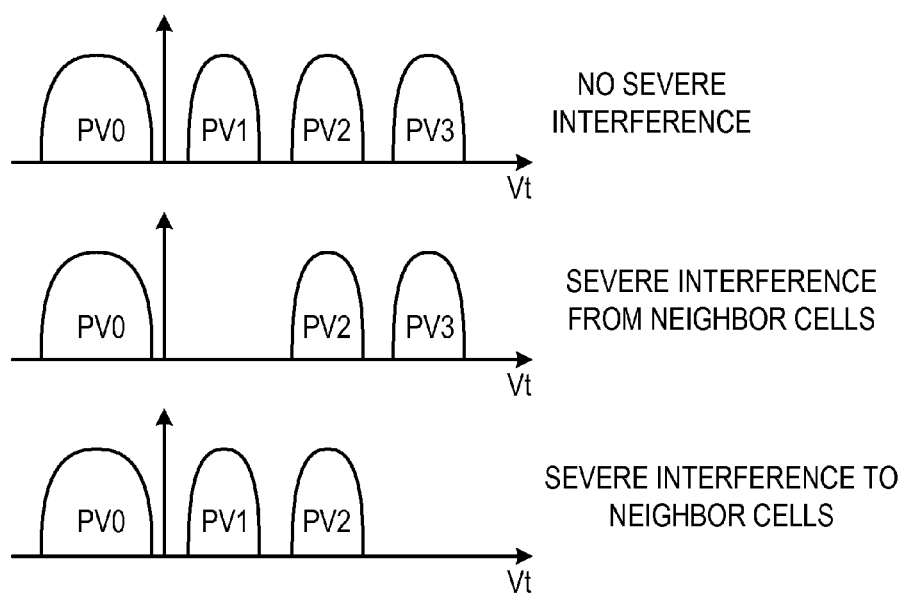
FIG. 6 is a graph showing selected programming level constellations for various interference scenarios, in accordance with an alternative embodiment of the present invention.

FIG. 6 is a graph showing selected programming level constellations for various interference scenarios, in accordance with an alternative embodiment of the present invention. In this example, the memory device uses a full baseline set of four programming levels denoted PV0 . . . PV3. PV0 also serves as an erased level. For a given memory cell, the system chooses a suitable subset of these programming levels depending on interference conditions.

If no severe interference is expected to/from the given memory cell, the system stores data in that cell using all four programming levels. This case is shown by the top graph of FIG. 6. If the memory cell suffers strong interference from one or more neighbor cells, the system stores data in the memory cell using PV0, PV2 and PV3. This case is shown by the middle graph. If the memory cell is expected to cause strong interference to one or more neighbor cells, the system stores data in the memory cell using PV0, PV1 and PV2. This case is shown by the bottom graph of FIG. 6.

In a typical programming flow, system 20 programs memory cells 32 in an ascending order of word lines. When programming a given word line, the system first selects a set of programming levels for use in each memory cell. This selection is based on the interference caused by the memory cell to previously-programmed memory cells (in the same word line or in previously-programmed word lines) and on the interference caused to the memory cell from other memory cells. For example, in some embodiments system 20 programs the even-order cells in a given word line first, and then the odd-order cells. In such embodiments, the programming levels can be selected for the entire word line, including both even- and odd-order cells, before programming of the word line.

Alternatively, the system may select the programming levels for the even-order cells based only on interference between them and previously-programmed word lines, and then select the programming levels for the odd-order cells based on interference between them and the even-order cells of the same word line as well as the previously-programmed word lines.

In one embodiment, the system programs a given word line by first selecting the programming levels for the memory cells, and then mapping data bits to programming levels and programming the memory cells. In an alternative embodiment, the system selects the programming levels for a given memory cell, then maps data and programs this memory cell, and only then moves to select the programming levels for the next memory cell in the word line.

In the former technique, the exact number of data bits stored in the word line depends on the selected sets of programming levels, but the deviation from the average number of bits per word line is expected to be small. The latter technique is typically more accurate in selecting the programming levels per memory cell, because it has more accurate information as to the interference to and from neighboring cells. On the other hand this technique may be more complex to implement. Further alternatively, the system may perform the selection of programming levels, the mapping of data to programming levels and the actual programming of the memory cells in any other suitable order.

In an example embodiment, the system uses the constellations of FIG. 6 while programming memory cells in array 28 in an ascending order of word lines (rows). Let i denote the word line (row) index and j denote the bit line (column) index. In this example, system 20 uses the following logic to select the subset of programming levels for the cell (i,j):

The full set of programming levels PV0 ... PV3 is used if interference is low.

Programming levels PV0, PV2 and PV3 are used if the memory cell is subject to strong interference from cells (i−1,j) and/or (i,j−1).

Programming levels PV0, PV1 and PV2 are used if the memory cell is expected to cause strong interference to cells (i−1,j) and/or (i,j−1) (for example because at least one of these neighbor cells is programmed to PV1, and memory cell (i,j) is to be programmed to PV3, which would cause level PV0 to overlap PV1 in the neighbor cells).

The programming level constellations of FIGS. 5A-5C and 6 are example constellations that are chosen purely for the sake of conceptual clarity. In alternative embodiments, system 20 may use any other suitable constellations of programming levels and any other suitable method of selecting the programming levels for a given memory cell based on interference.

In alternative embodiments, system 20 may select a respective subset of programming levels for programming each memory cell by encoding the data in a way that causes the data to be mapped only to the programming levels in the subset. Codes of this sort are addressed, for example, in U.S. Provisional Patent Application 61/372,921, cited above; and by Kuznetsov and Kasami, in "An Error Correcting Scheme for Defective Memory," IEEE Transactions on Information Theory, volume IT-24, no. 6, November, 1978, pages 712-718, which is incorporated herein by reference. See also an article by Armknecht et al., entitled "Efficient Computation of Algebraic Immunity for Algebraic and Fast Algebraic Attacks," Eurocrypt 2006, Springer-Verlag, which is incorporated herein by reference.

For example, consider a baseline constellation of four programming levels {L0, L1, L2, L3}, and assume that memory cells suffering from strong interference to the erased level are to be programmed using only the subset {L0, L2, L3} (i.e., omit level L1). The data for storage can be encoded with a suitable code, so as to produce a modified bit sequence that will never be mapped to L1 but only to the desired subset {L0, L2, L3}.

In an example embodiment, data is mapped to levels {L0, L1, L2, L3} using conventional 4-level MLC programming, i.e., Least Significant Bit (LSB) page programming followed by Most Significant Bit (MSB) page programming. In this example, the system may modify the data of the MSB page such that, for each cell that would conventionally be programmed to L1, the MSB data for that cell is inverted if the cell suffers strong interference from one or more neighbor cells.

This condition can be verified, for example, by examining the memory cells immediately before programming the MSB page, since at that time a considerable part of the interference is already present (the relevant interference in this case comprises mainly the interference to the erased level, which may also originate from previous word-lines). Erased cells with relatively high threshold voltages at this time should be marked as cells that should avoid using the L1 level.

Conditional data inversion of this sort may be implemented, for example, by performing bit-wise Exclusive-OR (XOR) between the data and a sequence that has "1" for every bit that should be inverted, "0" for every bit that must not be inverted (otherwise other cells will reach L1), and "do not care" elsewhere.

Such a sequence can be generated, for example, using a Linear Feedback Shift Register (LFSR). The seed of the LFSR is typically stored with the data such that data can be reconstructed during readout. The length of the LFSR seed typically corresponds to the number of cells for which the L1 level is to be avoided. The seed can be extracted, for example, by solving a set of linear equations over the finite binary Galois field GF(2), where each equation sets a specific output bit of the LFSR to its desired bit value ("0" or "1"). Using a longer seed will enable avoiding L1 for a larger portion of the desired cells with higher probability.

Alternatively to using an LFSR, the memory cells can be divided into groups of N cells. Within each group, the MSB data of all the cells is inverted if at least one cell meets the condition that requires inversion. A single bit is stored for each group so as to indicate whether the MSB data of this group is inverted or not. This technique assumes that the number of cells whose MSB data needs to be inverted is small. When using this technique, some cells that suffer from high interference may eventually reach L1, but their number will be small.

Further alternatively, system 20 may select a respective subset of programming levels for programming each memory cell using Trellis shaping. In these embodiments, the system adds parity bits to the data (e.g., p parity bits for every k data bits). The parity bits are chosen such that there will be a numerically-efficient way to enumerate all legal $2^k$ words. For example, the parity bits can be chosen as the parity of a convolutional code, and the code-words can be enumerated using the Viterbi algorithm. Then, the code-words are enumerated, and the code-word that optimizes a predefined criterion is chosen.

A similar approach used in communication systems is described in the article by Forney, cited above. In the disclosed technique, the predefined criterion may comprise, for example, minimization of interference to the previous word-line, or only to erased cells of the previous word-line. The Viterbi algorithm will automatically avoid using high programming levels in cases where the neighbor cell interference should be minimized. Interference reduction improves as the number of parity bits increases.

Storing Information Regarding Selected Programming Levels

In the embodiments described above, system 20 assigns a respective set of programming levels for each memory cell, and then stores data in that memory cell using the assigned set of programming levels. Thus, different memory cells may hold data that is stored using different sets of programming levels. When preparing to read data from a given memory cell, the system should be aware of the set of programming levels that was assigned to that cell, otherwise the data may not be read correctly.

For example, different sets of programming levels may have different mapping of data, or they may be read using different read thresholds. In particular, different memory cells may hold different numbers of bits. In such a case, reading a given memory cell using the wrong set of programming levels may cause a propagating error that affects readout from subsequent memory cells. For example, using the wrong set of programming levels may cause "insertion errors" or "deletion errors" in which spurious data bits are mistakenly inserted or removed from the sequence of detected data bits, which shifts the position of subsequent bits in the sequence.

In some embodiments, system 20 (typically MSP 40) stores information that is indicative of the sets of programming levels assigned to the various memory cells. The information may be stored in memory array 28 or in any other suitable location. When preparing to read data from a group of memory cells 32 (e.g., a word line), system 20 queries the stored information, and then reads the memory cells in accordance with the sets of programming levels indicated by this information.

In some embodiments, system 20 compresses the information regarding the sets of programming levels, in order to reduce the memory space needed to store it. In one example embodiment, system 20 represents each possible set of programming levels by a respective unique binary string. Typically, the different binary strings are of the same length. The system concatenates the binary strings for the memory cells of a given cell group (a word line in the present example), to form a binary word. The binary word of a given word line indicates the sets of programming levels that were used for storing data in the various memory cells of that word line. The system encodes the binary word with a certain systematic Error Correction Code (ECC) so as to produce redundancy bits, and stores only the redundancy bits of the ECC.

When reading the given word line, the system reads the previous word line as well, or all the cells that interfere with the page of cells whose data is requested, and attempts to recreate the process of selecting programming levels for the given word line, based on the read previous word line. In other words, the system generates an estimate of the binary word of the given word line based on the read results of the previous word line. Then, the system corrects any errors in the estimated binary word using the stored redundancy information that was originally computed for the true binary word. Using this technique, the system is able to reconstruct the programming levels assigned to the different memory cells in the given word line while storing only a relatively small number of redundancy bits.

Once the binary word is reconstructed, the system is able to determine the set of programming levels used for each memory cell, and therefore read the data correctly. In some embodiments, the system stores the redundancy information using a high-reliability storage configuration, e.g., using only a single bit per cell (two programming levels per memory cell).

In alternative embodiments, system 20 may use any other suitable compression mechanism to reduce the memory space needed for storing the information that indicates the assigned sets of programming levels. Note that the ECC redundancy bits that are stored in this scheme convey information on the data of the interfering cells, and can therefore be used to aid in detecting this data.

Data Storage Method Description

Figure 7:
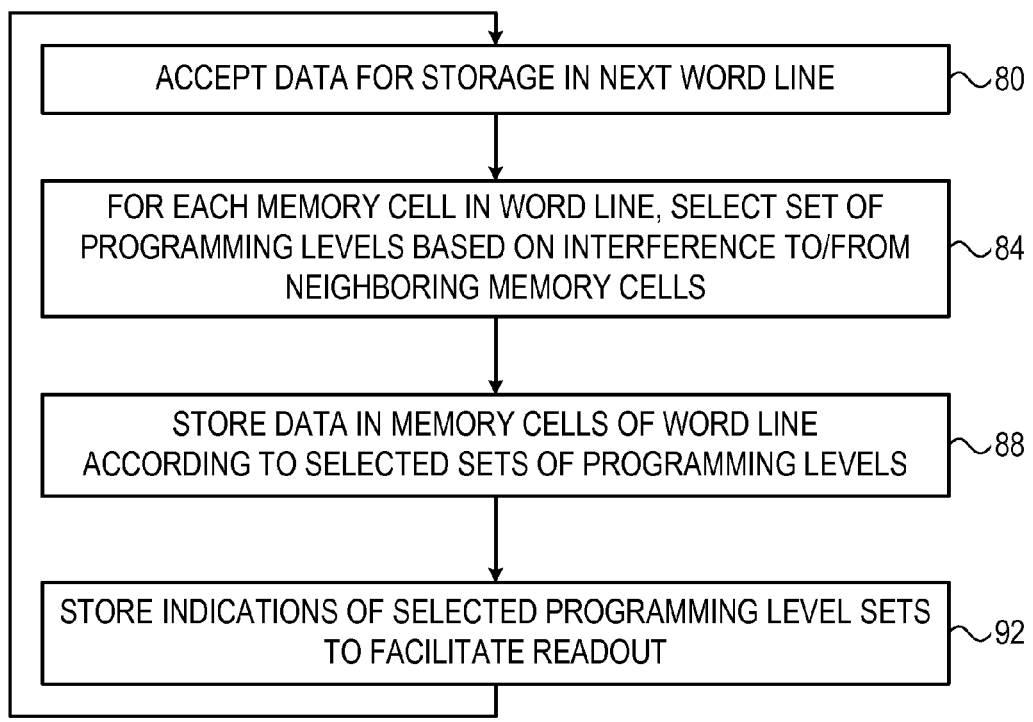
FIG. 7 is a flow chart that schematically illustrates a method for data storage, in accordance with an embodiment of the present invention.

FIG. 7 is a flow chart that schematically illustrates a method for data storage, in accordance with an embodiment of the present invention. The method begins with system 20 accepting data for storage in a given word line, at an input step 80. For each memory cell in the word line, the system selects a respective set of programming levels that are to be used in storing data in that memory cell, at a level selection step 84. As explained above, the selection of programming levels for a particular memory cell depends on the level of interference between that memory cell and at least one other memory cell in array 28.

System 20 then stores the data in the memory cells of the word line in accordance with the respective selected sets of programming levels, at a data storage step 88. The system stores information that is indicative of the selected sets of programming levels, at an indication storage step 92. The method then loops back to step 80 above, in order to store the data of the next word line.

In the embodiments described herein, the assignment of programming levels (selection of nominal analog values) for each memory cell is carried out by R/W circuitry 38 in memory device 24. In alternative embodiments, however, this task or parts thereof can be carried out by MSP 40 or other memory controller. Generally, assignment of programming levels (selection of nominal analog values) for the memory cells can be carried out by any suitable programming circuitry, which may comprise R/W circuitry 38, MSP 40, and/or any other suitable system element.

Additional Embodiments

Figure 8A:
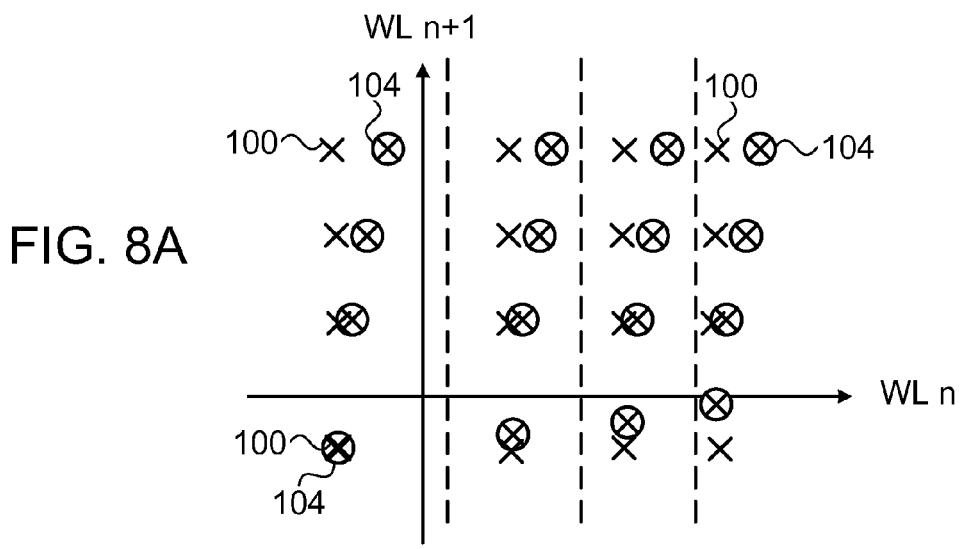
FIGS. 8A-8C are graphs showing programming level constellations, in accordance with embodiments of the present invention.
Figure 8B:
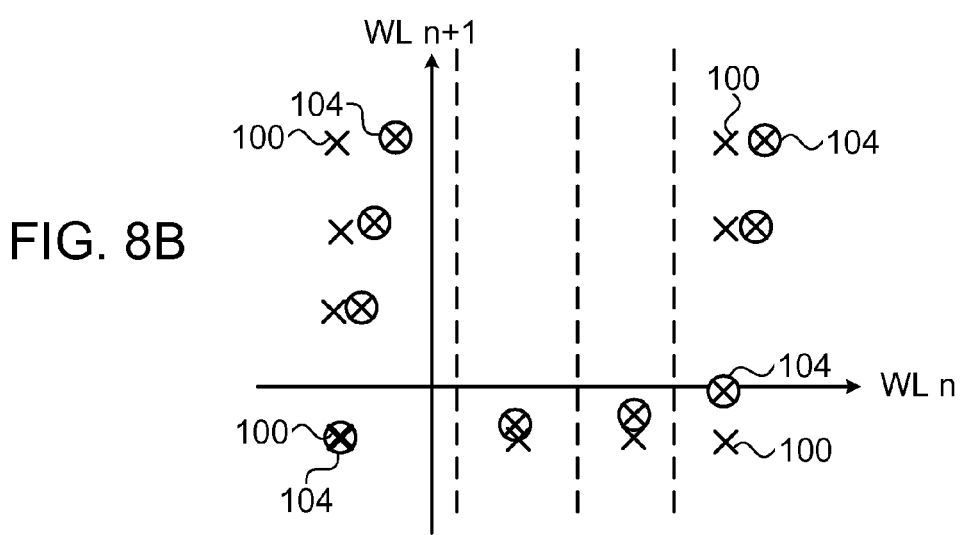
Figure 8C:
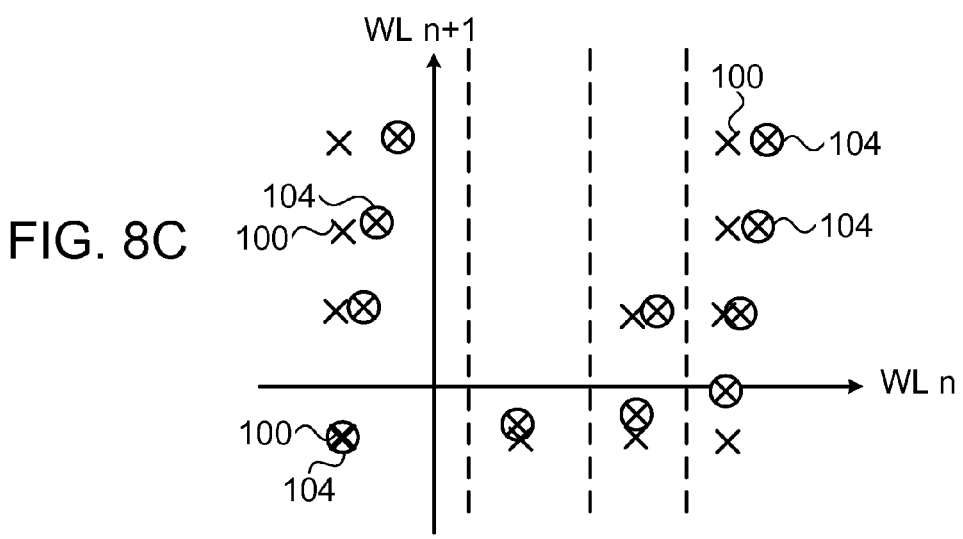

FIGS. 8A-8C are graphs showing programming level constellations, in accordance with embodiments of the present invention. In these embodiments, a joint constellation of programming levels is used for programming a target memory cell and an interfering memory cell that causes interference to the target cell. In the embodiments of FIGS. 8A-8C the target and interfering cells are vertical neighbors, i.e., belong to the same bit line and to adjacent word lines. In alternative embodiments, however, this technique can be used with any other pair of target and interfering memory cells. For example, when each word line is divided into odd- and even-order cells that are programmed separately, the target and interfering memory cells may be horizontal neighbors, i.e., neighboring cells belonging to the same word line.

FIG. 8A shows a constellation of programming levels that does not use the disclosed technique, as a reference. In this example, the target memory cell belongs to a word line denoted $WL_n$, and the interfering memory cell is the vertical neighbor of the target memory cell in the next word line, denoted $WL_{n+1}$. Since $WL_{n+1}$ is programmed after $WL_n$, the P&V process does not cancel this interference.

The programming levels of the two memory cells are shown as two-dimensional coordinates, wherein the horizontal axis corresponds to the threshold voltage of the target cell (in $WL_n$), and the vertical axis corresponds to the threshold voltage of the interfering cell (in $WL_{n+1}$). In the present example, each memory cell holds two bits in four programming levels. Thus, the programming levels of the two memory cells correspond to sixteen nominal analog values 100, marked as "X" in the figure. Without interference or other impairments (e.g., aging-related drift), the threshold voltage distributions of the memory cells are typically centered at these analog values.

When the interfering memory cell causes cross-coupling interference to the target memory cell, the programming levels are typically distorted. In an example interference scenario, the programming levels correspond to distorted analog values 104, marked as "⊗" in the figure. This distortion typically degrades the storage reliability of the memory cells. In FIG. 8A, for example, the read thresholds used for reading the target memory cell are marked by vertical dashed lines in the figure. The read thresholds are typically positioned midway between adjacent nominal analog values 100. When interference is present, however, some of distorted analog values 104 become closer to the read thresholds, and this effect increases the probability of read errors.

FIG. 8B shows an alternative constellation of programming levels, in accordance with an embodiment of the present invention. The constellation of FIG. 8B uses only a subset of the programming levels of FIG. 8A, in order to reduce the probability of read errors caused by the interference. The constellation of FIG. 8B includes the programming levels whose distorted analog values 104 are sufficiently distant from the read thresholds. Programming levels whose distorted analog values 104 are close to the read thresholds have been removed from the constellation.

Thus, the constellation of FIG. 8B has a considerably lower error probability than the constellation of FIG. 8A in the presence of interference. On the other hand, the constellation of FIG. 8B has a lower storage capacity, because it has a smaller number of programming levels. In the present example, the constellation of FIG. 8A has a capacity of 2 bits/cell, whereas the constellation of FIG. 8B has a capacity of 1.5 bits/cell.

FIG. 8C shows another example constellation of programming levels, in accordance with an alternative embodiment of the present invention. This constellation includes two additional programming levels that are not included in the constellation of FIG. 8B. As a result, the storage capacity of this constellation is slightly higher (~1.66 bits/cell on average) at the expense of slightly degraded error probability.

The programming level constellations of FIGS. 8A-8C are example constellations, which were chosen purely for the sake of conceptual clarity. In alternative embodiments, any other suitable constellations can also be used. For example, the disclosed technique can be used with memory cells that hold any suitable number of bits per cell, e.g., eight-level or sixteen-level memory cells. Any suitable mapping of programming levels to bits can be used.

Although the embodiments described herein mainly address floating-gate interference between memory cells, the methods and systems described herein can also be used to combat other impairments, such as program disturbs and other types of cross-cell interference. In the present context, any such impairment or distortion is regarded as a kind of interference.

The description above refers mainly to a linear model for inter-cell interference, in which the voltage shift in the interfered cell is proportional to the read voltage X of the interfering cell. The proposed methods are similarly applicable to any other suitable non-linear or linear interference models. For example, in some cases it may be more accurate to model the voltage shift in the interfered cell as linearly proportional to the amount of charge in the interfering cell, which is proportional to the readout value of the interfering cell in the absence of interference to the interfering cell.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method for data storage, comprising:

accepting data for storage in a memory comprising multiple analog memory cells;

assigning, for each memory cell, a respective set of nominal analog values for representing data values to be stored in the memory cell, by choosing the nominal analog values for a given memory cell in a respective range that depends on interference between the given memory cell and at least one other memory cell in the memory;

wherein assigning the nominal analog values comprises, for a group of N memory cells, dividing an N-dimensional space that includes a number of combinations of respective analog values of the N memory cells into a first region that includes combinations of nominal analog values that are unavailable for assignment due to the interference, and a second region that includes combinations of nominal analog values that are available for assignment, and assigning the sets of the nominal analog values to the N memory cells only within the second region; and storing the data in each memory cell using the respective selected set of the nominal analog values.

2. The method according to claim 1, wherein assigning the nominal analog values comprises choosing the nominal analog values for the given memory cell in a first range when the given memory cell is subjected to the interference from the at least one other memory cell, and choosing the nominal analog values for the given memory cell in a second range, lower than the first range, when the given memory cell is not subjected to the interference from the at least one other memory cell.

3. The method according to claim 1, wherein assigning the nominal analog values comprises choosing the nominal analog values for the given memory cell in a first range when the given memory cell is expected to cause the interference to the at least one other memory cell, and choosing the nominal analog values for the given memory cell in a second range, higher than the first range, when the given memory cell is not expected to cause the interference to the at least one other memory cell.

4. The method according to claim 1, wherein assigning the nominal analog values comprises selecting, for each memory cell, at least one parameter selected from a group of parameters consisting of a minimum programming voltage, a maximum programming voltage, and a size of the set of the nominal analog values.

5. The method according to claim 1, wherein the second region is non-cubical.

6. The method according to claim 1, wherein the second region is a polytope.

7. The method according to claim 1, wherein assigning the nominal analog values comprises choosing the nominal analog values in the range in which a maximum difference between the nominal analog values assigned to the given memory cell and the nominal analog values assigned to the at least one other memory cell does not exceed a predefined threshold.

8. The method according to claim 1, wherein assigning the nominal analog values comprises assigning to the given memory cell a first number of the analog values when the interference is low, and a second number of the analog values, lower than the first number, when the interference is high.

9. The method according to claim 1, wherein assigning the nominal analog values comprises providing a baseline set of the analog values, and assigning to each memory cell a respective subset of the baseline set, which lies in the respective range, depending on the interference.

10. The method according to claim 1, wherein storing the data comprises encoding the accepted data with a code that causes the encoded data to be mapped to the nominal analog values chosen within the respective range in each memory cell.

11. The method according to claim 10, wherein the code comprises a Trellis Shaping code.

12. The method according to claim 1, wherein assigning the nominal analog values for a group of the memory cells comprises initially choosing the nominal analog values for all the memory cells in the group, and subsequently mapping a respective data value to one of the chosen nominal analog values in each of the memory cells.

13. The method according to claim 1, wherein assigning the nominal analog values for a group of the memory cells comprises choosing the nominal analog values for a first memory cell in the group and mapping a respective data value to one of the nominal analog values chosen for the first memory cell, and choosing the nominal analog values for a second memory cell in the group based on the data value mapped to the first memory cell.

14. The method according to claim 1, wherein assigning the nominal analog values comprises assigning at least one negative nominal analog value for representing a non-erased programming level.

15. The method according to claim 1, and comprising storing information indicative of the assigned sets of the nominal analog values.

16. The method according to claim 15, and comprising retrieving the data from the memory cells by retrieving the stored information, recreating the assigned sets from the retrieved information, and reading the data from the memory cells in accordance with the recreated sets of the nominal analog values.

17. The method according to claim 16, wherein storing the information comprises encoding the information with an Error Correction Code (ECC) to produce data bits and redundancy bits and storing only the redundancy bits, and wherein recreating the assigned sets comprises reading some of the memory cells so as to estimate assignment of the sets, applying error correction to the estimated assignment using the stored redundancy bits, and recreating the sets from the estimated assignment after the error correction.

18. The method according to claim 1, wherein the memory cells comprise at least first and second memory cells, and wherein assigning the nominal analog values comprises assigning respective, different first and second sets of the analog values to the first and second memory cells.

19. The method according to claim 1, wherein assigning the nominal analog values comprises assigning to first and second memory cells respective first and second sets of the nominal analog values having at least one nominal analog value in common.

20. The method according to claim 1, wherein assigning the nominal analog values comprises assigning to first and second memory cells respective first and second sets of the nominal analog values, such that the first set is a subset of the second set.

21. The method according to claim 1, wherein two or more memory cells are assigned respective sets of the nominal analog values that are drawn from a superset of K possible nominal analog values, and wherein storing the data comprises shaping a sequence of data bits into respective shaped bits by mapping the sequence of data bits to a subset of the K possible nominal analog values, and storing the shaped bits in the respective memory cells using the assigned respective sets.

22. A data storage apparatus, comprising:
an interface for communicating with a memory comprising multiple analog memory cells; and
programming circuitry configured to:
accept data for storage in the memory;
assign, for each memory cell, a respective set of nominal analog values for representing data values to be stored in the memory cell, by choosing the nominal analog values for a given memory cell in a respective range that depends on interference between the given memory cell and at least one other memory cell in the memory;
divide, for a group of N memory cells, an N-dimensional space that includes a number of combinations of respective analog values of the N memory cells into a first region that includes combinations of nominal analog values that are unavailable for assignment due to the interference, and a second region includes combinations of nominal analog values that are available for assignment, and to assign the sets of the nominal analog values to the N memory cells only within the second region; and
store the data in each memory cell using the respective selected set of the nominal analog values.

23. The apparatus according to claim 22, wherein the programming circuitry is configured to choose the nominal analog values for the given memory cell in a first range when the given memory cell is subjected to the interference from the at least one other memory cell, and to choose the nominal analog values for the given memory cell in a second range, lower than the first range, when the given memory cell is not subjected to the interference from the at least one other memory cell.

24. The apparatus according to claim 22, wherein the programming circuitry is configured to choose the nominal analog values for the given memory cell in a first range when the given memory cell is expected to cause the interference to the at least one other memory cell, and to choose the nominal analog values for the given memory cell in a second range, higher than the first range, when the given memory cell is not expected to cause the interference to the at least one other memory cell.

25. The apparatus according to claim 22, wherein the programming circuitry is configured to select, for each memory cell, at least one parameter selected from a group of parameters consisting of a minimum programming voltage, a maximum programming voltage, and a size of the set of the nominal analog values.

26. The apparatus according to claim 22, wherein the second region is non-cubical.

27. The apparatus according to claim 22, wherein the second region is a polytope.

28. The apparatus according to claim 22, wherein the programming circuitry is configured to choose the nominal analog values in the range in which a maximum difference between the nominal analog values assigned to the given memory cell and the nominal analog values assigned to the at least one other memory cell does not exceed a predefined threshold.

29. The apparatus according to claim 22, wherein the programming circuitry is configured to assign to the given memory cell a first number of the analog values when the interference is low, and a second number of the analog values, lower than the first number, when the interference is high.

30. The apparatus according to claim 22, wherein the programming circuitry is configured to hold a baseline set of the analog values, and to assign to each memory cell a respective subset of the baseline set, which lies in the respective range, depending on the interference.

31. The apparatus according to claim 22, wherein the programming circuitry is configured to encode the accepted data with a code that causes the encoded data to be mapped to the nominal analog values chosen within the respective range in each memory cell.

32. The apparatus according to claim 31, wherein the code comprises a Trellis Shaping code.

33. The apparatus according to claim 22, wherein the programming circuitry is configured to assign the sets for a group of the memory cells by initially choosing the nominal analog values for all the memory cells in the group, and subsequently mapping a respective data value to one of the chosen nominal analog values in each of the memory cells.

34. The apparatus according to claim 22, wherein the programming circuitry is configured to assign the sets for a group of the memory cells by choosing the nominal analog values for a first memory cell in the group and mapping a respective data value to one of the nominal analog values chosen for the first memory cell, and choosing the nominal analog values for a second memory cell in the group based on the data value mapped to the first memory cell.

35. The apparatus according to claim 22, wherein the programming circuitry is configured to assign at least one negative nominal analog value for representing a non-erased programming level.

36. The apparatus according to claim 22, wherein the programming circuitry is configured to store information indicative of the assigned sets of the nominal analog values.

37. The apparatus according to claim 36, wherein the programming circuitry is configured to retrieve the data from the memory cells by retrieving the stored information, recreating the assigned sets from the retrieved information, and reading the data from the memory cells in accordance with the recreated sets of the nominal analog values.

38. The apparatus according to claim 37, wherein the programming circuitry is configured to store the information by encoding the information with an Error Correction Code (ECC) so as to produce data bits and redundancy bits and storing only the redundancy bits, and to recreate the assigned sets by reading some of the memory cells so as to estimate assignment of the sets, applying error correction to the estimated assignment using the stored redundancy bits, and recreating the sets from the estimated assignment after the error correction.

39. The apparatus according to claim 22, wherein the memory cells comprise at least first and second memory cells, and wherein the programming circuitry is configured to assign respective, different first and second sets of the analog values to the first and second memory cells.

40. The apparatus according to claim 22, wherein the programming circuitry is configured to assign to first and second memory cells respective first and second sets of the nominal analog values having at least one nominal analog value in common.

41. The apparatus according to claim 22, wherein the programming circuitry is configured to assign to first and second memory cells respective first and second sets of the nominal analog values, such that the first set is a subset of the second set.

42. The apparatus according to claim 22, wherein two or more memory cells are assigned respective sets of the nominal analog values that are drawn from a superset of K possible nominal analog values, and wherein the programming circuitry is configured to shape a sequence of data bits into respective shaped bits by mapping the sequence of data bits to a subset of the K possible nominal analog values, and to store the shaped bits in the respective memory cells using the assigned sets.

43. A data storage apparatus, comprising:
a memory comprising multiple analog memory cells; and
programming circuitry configured to:
  accept data for storage in the memory;
  assign, for each memory cell, a respective set of nominal analog values for representing data values to be stored in the memory cell, by choosing the nominal analog values for a given memory cell in a respective range that depends on interference between the given memory cell and at least one other memory cell in the memory;
  divide, for a group of N memory cells, an N-dimensional space that includes a number of combinations of respective analog values of the N memory cells into a first region that includes combinations of nominal analog values that are unavailable for assignment due to the interference, and a second region includes combinations of nominal analog values that are available for assignment, and to assign the sets of the nominal analog values to the N memory cells only within the second region; and
  store the data in each memory cell using the respective selected set of the nominal analog values.

* * * * *